United States Patent
Hirai et al.

(10) Patent No.: US 12,426,337 B1
(45) Date of Patent: Sep. 23, 2025

(54) SEMICONDUCTOR DEVICE

(71) Applicant: Nuvoton Technology Corporation Japan, Kyoto (JP)

(72) Inventors: Eiichi Hirai, Kyoto (JP); Tsubasa Inoue, Kyoto (JP); Hironao Nakamura, Kyoto (JP); Yusuke Ito, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 19/213,615

(22) Filed: May 20, 2025

Related U.S. Application Data

(63) Continuation of application No. PCT/JP2024/024454, filed on Jul. 5, 2024.

(60) Provisional application No. 63/568,232, filed on Mar. 21, 2024.

(51) Int. Cl.
*H10D 64/00* (2025.01)
*H10D 30/63* (2025.01)
*H10D 62/10* (2025.01)
*H10D 64/23* (2025.01)
*H10D 64/27* (2025.01)
*H10D 84/83* (2025.01)

(52) U.S. Cl.
CPC ......... *H10D 64/2527* (2025.01); *H10D 30/63* (2025.01); *H10D 62/126* (2025.01); *H10D 64/518* (2025.01); *H10D 84/837* (2025.01)

(58) Field of Classification Search
CPC .. H10D 64/2527; H10D 62/126; H10D 30/63; H10D 64/518; H10D 84/837
See application file for complete search history.

(56) References Cited

U.S. PATENT DOCUMENTS

| | | | |
|---|---|---|---|
| 11,715,795 B2 * | 8/2023 | Okawa | H10D 84/148 |
| | | | 257/330 |
| 2013/0320454 A1 | 12/2013 | Suzuki et al. | |
| 2015/0129958 A1 | 5/2015 | Nita et al. | |
| 2019/0273141 A1 | 9/2019 | Yoshida et al. | |
| 2019/0319126 A1 | 10/2019 | Matsushima et al. | |
| 2020/0365729 A1 | 11/2020 | Okawa et al. | |

(Continued)

FOREIGN PATENT DOCUMENTS

| | | |
|---|---|---|
| JP | 2013-247309 A | 12/2013 |
| JP | 2015-095550 A | 5/2015 |

(Continued)

OTHER PUBLICATIONS

International Search Report dated Sep. 17, 2024 issued in International Patent Application No. PCT/JP2024/024454.

(Continued)

*Primary Examiner* — Mark V Prenty
(74) *Attorney, Agent, or Firm* — Rimon P.C.

(57) ABSTRACT

A semiconductor device has a shape of a rectangular in which the side length in a first direction is greater than or equal to the side length in a second direction in a plan view, and includes 2n+1 obround first source pads of a first vertical MOS transistor that are arranged in stripes at positions within a first area and extend in the second direction and 2n+1 obround second source pads of a second vertical MOS transistor that are arranged in stripes at positions within a second area and extend in the second direction.

9 Claims, 9 Drawing Sheets

(56) References Cited

U.S. PATENT DOCUMENTS

| | | |
|---|---|---|
| 2020/0395479 A1 | 12/2020 | Fujioka et al. |
| 2023/0215940 A1 | 7/2023 | Yamamoto et al. |
| 2023/0307393 A1 | 9/2023 | Yamamoto et al. |

FOREIGN PATENT DOCUMENTS

| | | |
|---|---|---|
| JP | 2019-129308 A | 8/2019 |
| JP | 2020-025115 A | 2/2020 |
| JP | 2022-153382 A | 10/2022 |
| JP | 2023-084132 A | 6/2023 |
| WO | 2018/123799 A1 | 7/2018 |
| WO | 2020/129786 A1 | 6/2020 |

OTHER PUBLICATIONS

Decision to Grant a Patent dated Feb. 18, 2025 issued in Japanese Patent Application No. 2025-502651, with English translation.

\* cited by examiner

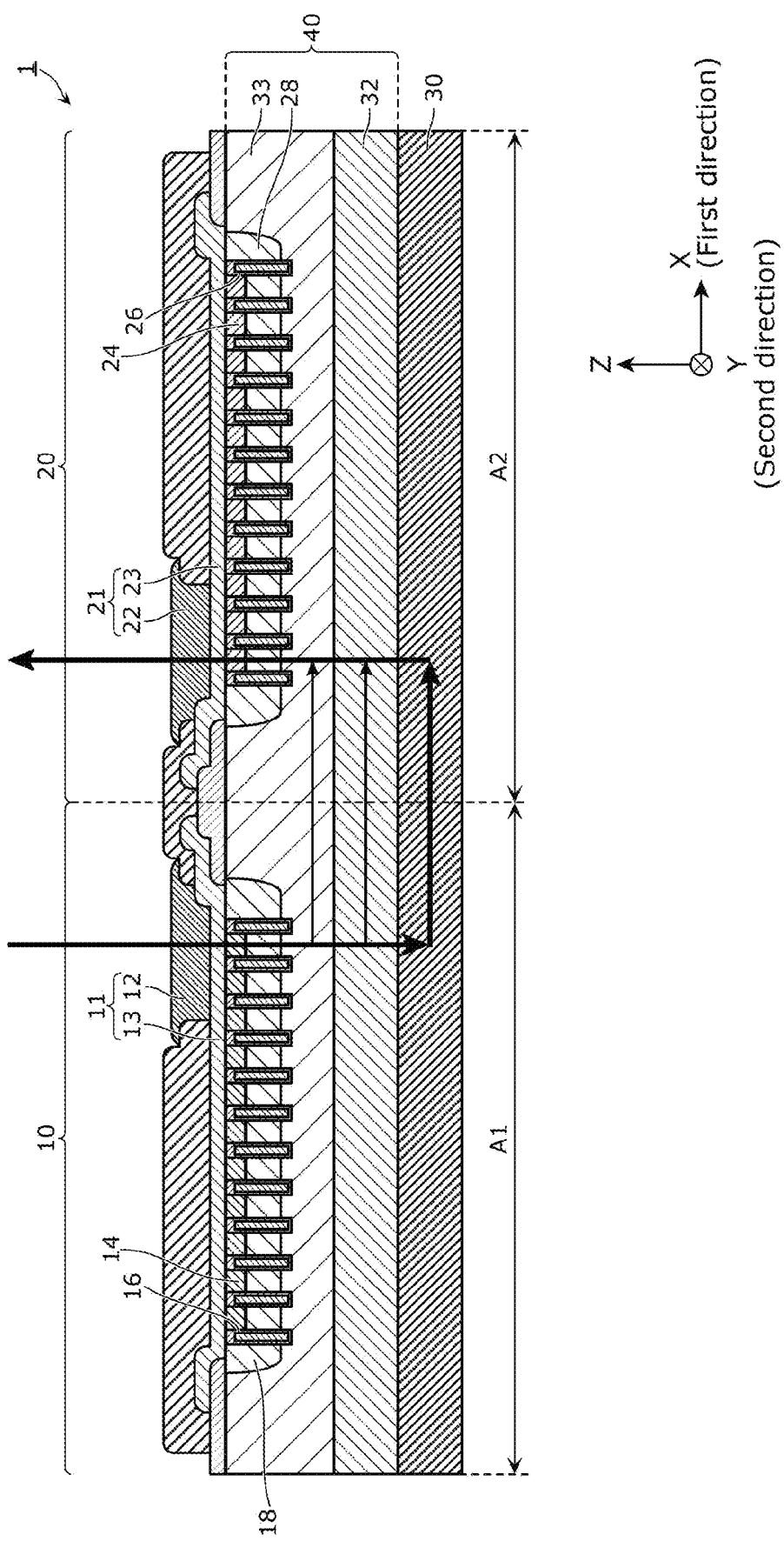

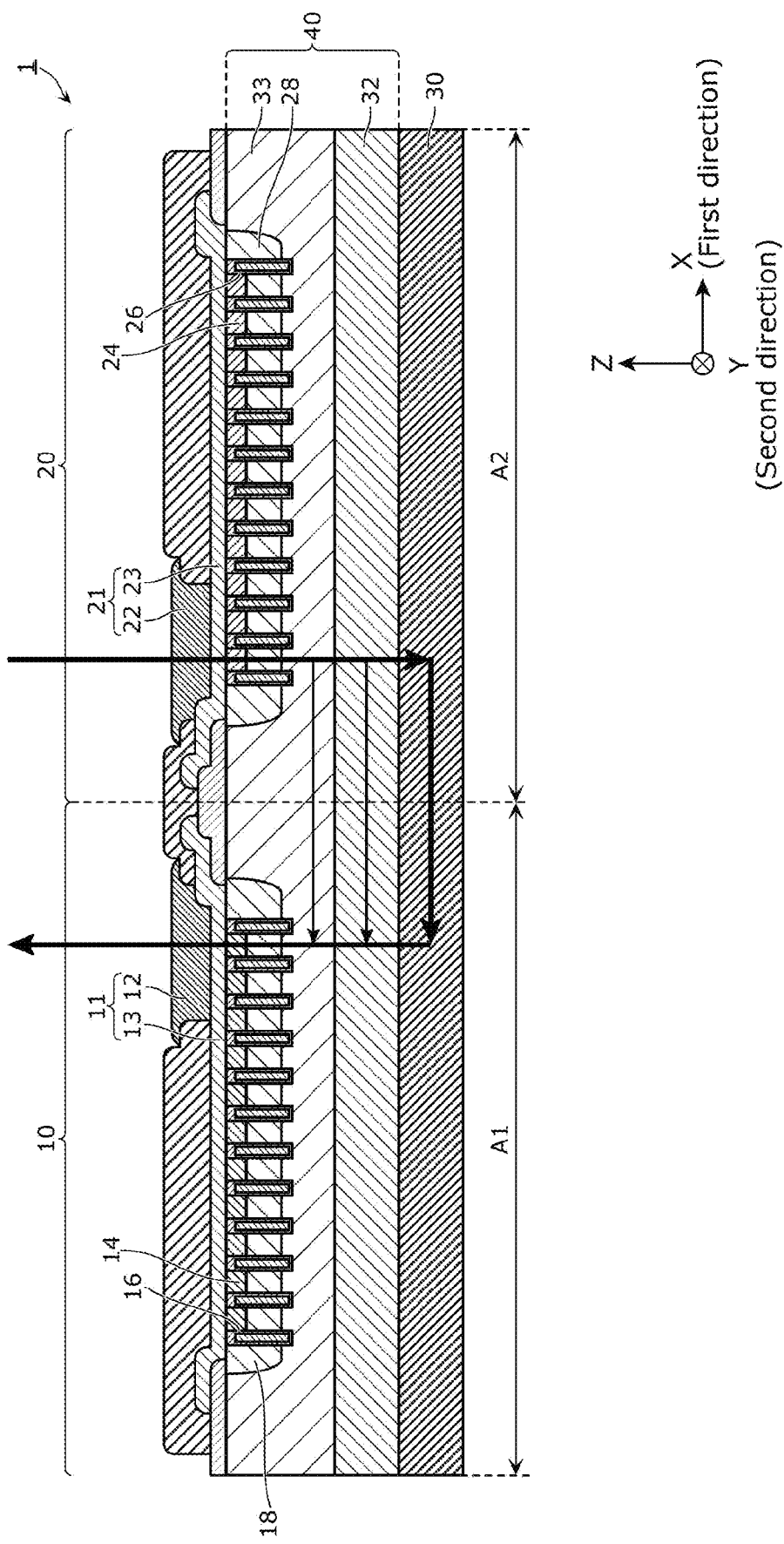

SEMICONDUCTOR DEVICE

CROSS REFERENCE TO RELATED APPLICATIONS

This is a continuation application of PCT International Patent Application No. PCT/JP2024/024454 filed on Jul. 5, 2024, designating the United States of America, which is based on and claims priority of U.S. Provisional Patent Application No. 63/568,232 filed on Mar. 21, 2024. The entire disclosures of the above-identified applications, including the specifications, drawings and claims are incorporated herein by reference in their entirety.

FIELD

The present disclosure relates to a semiconductor device.

BACKGROUND

A semiconductor device that is mounted on a mount substrate and switches between conduction and non-conduction of the current path of the mount substrate is conventionally known (see Patent Literature (PTL) 1, for example).

CITATION LIST

Patent Literature

PTL 1: International Publication No. WO2020/129786

SUMMARY

Technical Problem

In general, in a mount substrate, a current path along which a large current flows is designed to decrease the continuity resistance. Thus, it is necessary for a semiconductor device that is mounted on a mount substrate and switches between conduction and non-conduction of a current path along which a large current flows to have features suitable for decreasing the continuity resistance of the current path of the mount substrate.

Meanwhile, a semiconductor device configured by stacking a semiconductor layer and a metal layer to decrease the continuity resistance of the semiconductor device is known.

When such a semiconductor device configured by stacking a semiconductor layer and a metal layer is mounted face down onto a mount substrate in a high-temperature environment during, for example, reflow soldering, warp may occur in the semiconductor device in the high-temperature environment due to the differences in physical properties, such as the thermal expansion coefficient and Young's modulus, between the semiconductor layer and the metal layer.

The warp may cause mounting failures such as overflowing of solder and generation of an insufficiently soldered portion.

In view of this, the present disclosure aims to provide a semiconductor device that can suppress the occurrence of a mounting failure in mounting the semiconductor device onto a mount substrate, in addition to having features suitable for decreasing the continuity resistance of the current path of the mount substrate for mounting the semiconductor device.

Solution to Problem

A semiconductor device according to one aspect of the present disclosure is a semiconductor device that is a face-down mountable, chip-size-package type semiconductor device. The semiconductor device includes: a semiconductor layer; a metal layer provided in contact with a back surface of the semiconductor layer; a first vertical metal-oxide-semiconductor (MOS) transistor provided in a first area of the semiconductor layer; a second vertical MOS transistor provided in a second area of the semiconductor layer, the second area being adjacent to the first area in a plan view of the semiconductor device; a first gate pad and $2n+1$ first source pads of the first vertical MOS transistor that are provided at positions within the first area in the plan view, on a top surface of the semiconductor device, n being an integer greater than or equal to 1; and a second gate pad and $2n+1$ second source pads of the second vertical MOS transistor that are provided at positions within the second area in the plan view, on the top surface of the semiconductor device. On a same side as the back surface, the semiconductor layer includes a semiconductor substrate that is a common drain region shared by the first vertical MOS transistor and the second vertical MOS transistor. In the plan view, the semiconductor layer has a shape of a rectangle having a first side, a second side, a third side, and a fourth side, the first side and the second side extending in a first direction and having an equal length, the third side and the fourth side extending in a second direction orthogonal to the first direction and having an equal length that is a length less than or equal to the equal length of the first side and the second side, the first area and the second area are one and another of two equal halves of an area of the semiconductor layer, the third side is included in a perimeter of the first area, and the fourth side is included in a perimeter of the second area, a boundary line between the first area and the second area is crank-shaped by connecting an entirety of a third segment, an entirety of a first segment, an entirety of a fourth segment, an entirety of a second segment, and an entirety of a fifth segment in order stated, from one end of the boundary line toward another end of the boundary line, the first segment and the second segment extending in a straight line in the first direction, the third segment, the fourth segment, and the fifth segment extending in a straight line in the second direction, the boundary line monotonously changing in the first direction and the second direction from the one end toward the other end, a length of the first segment is equal to a length of the second segment, a length of the third segment is equal to a length of the fifth segment, the one end of the boundary line is on the first side, and the other end of the boundary line is on the second side, the fourth segment is on a virtual center line of the semiconductor layer that divides the area of the semiconductor layer into two equal halves in the plan view and extends in a straight line in the second direction, the first gate pad is circular, a center of the first gate pad is on the virtual center line, and no other pads are present between the first gate pad and the second side, the second gate pad is circular and has a diameter identical to a diameter of the first gate pad, a center of the second gate pad is on the virtual center line, and no other pads are present between the second gate pad and the first side, the $2n+1$ first source pads and the $2n+1$ second source pads each have a shape of an obround whose longitudinal direction matches the second direction, and the $2n+1$ first source pads and the $2n+1$ second source pads have an equal width in a lateral direction, the $2n+1$ first source pads include a first closest source pad closest to the fourth segment and $2n$ first non-closest source pads not closest to the fourth segment, the first closest source pad is so disposed that an axis of line symmetry, extending in the longitudinal direction, of the first closest source pad matches a first closest equal-interval line closest to the fourth segment among n+1 first equal-interval lines that are virtual lines extending in the second direction in the first area and arranged at equal intervals in the first direction, the 2n first non-closest source pads are so disposed that with regard to each of n first non-closest equal-interval lines that are lines except the first closest equal-interval line included in the n+1 first equal-interval lines, axes of line symmetry, extending in the longitudinal direction, of two first non-closest source pads among the 2n first non-closest source pads match the first non-closest equal-interval line, the 2n+1 second source pads include a second closest source pad closest to the fourth segment and 2n second non-closest source pads not closest to the fourth segment, the second closest source pad is so disposed that an axis of line symmetry, extending in the longitudinal direction, of the second closest source pad matches a second closest equal-interval line closest to the fourth segment among n+1 second equal-interval lines that are virtual lines extending in the second direction in the second area and arranged at equal intervals in the first direction, the 2n second non-closest source pads are so disposed that with regard to each of n second non-closest equal-interval lines that are lines except the second closest equal-interval line included in the n+1 second equal-interval lines, axes of line symmetry, extending in the longitudinal direction, of two second non-closest source pads among the 2n second non-closest source pads match the second non-closest equal-interval line, and the 2n+1 first source pads and the 2n+1 second source pads are symmetrical with respect to the virtual center line as an axis of line symmetry.

Advantageous Effects

A semiconductor device according to one aspect of the present disclosure is a semiconductor device that can suppress the occurrence of a mounting failure in mounting the semiconductor device onto a mount substrate, in addition to having features suitable for decreasing the continuity resistance of the current path of the mount substrate for mounting the semiconductor device.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5A is a cross-sectional view schematically illustrating a situation in which a current is flowing along the first current path of the semiconductor device according to the embodiment.

FIG. 5B is a cross-sectional view schematically illustrating a situation in which a current is flowing along the second current path of the semiconductor device according to the embodiment.

Figure 1:
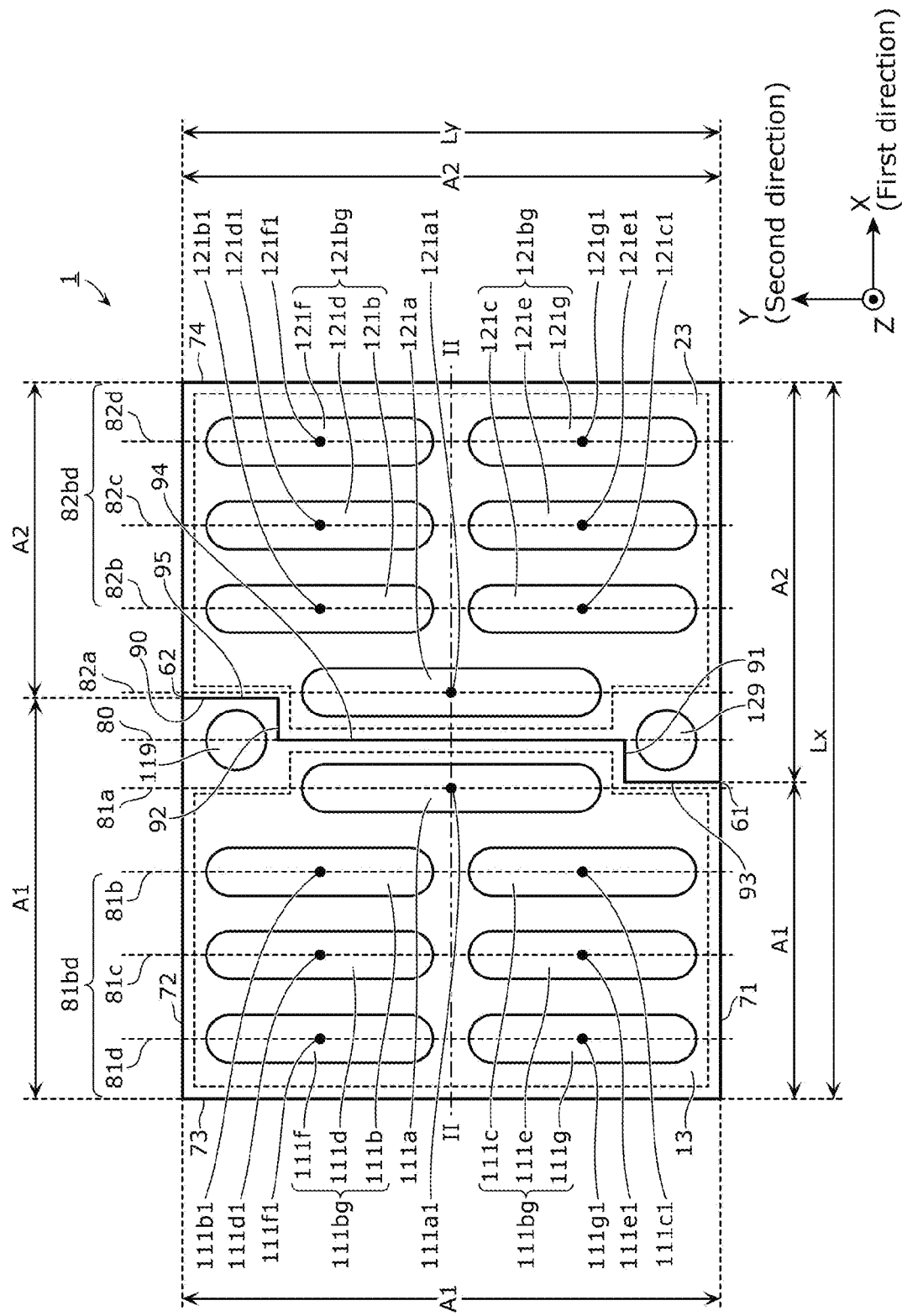
FIG. 1 is a plan view illustrating an example of a structure of a semiconductor device according to an embodiment.

DESCRIPTION OF EMBODIMENT (Circumstances Leading to One Aspect of the Present Disclosure)

When a semiconductor device configured by stacking a semiconductor layer and a metal layer is mounted face down onto a mount substrate in a high-temperature environment during, for example, reflow soldering, if warp occurs in the semiconductor device, it is conventionally known that the direction of the warp matches the direction in which a curvature occurs in the longitudinal direction of the semiconductor device viewed in a plan view.

Thus, in the semiconductor device configured as above, in order to suppress the occurrence of a mounting failure due to the warp by ensuring the fluidity of solder during the reflow soldering, relatively large pads provided on the surface of the semiconductor device are formed in shapes of obrounds whose longitudinal direction matches the longitudinal direction of a semiconductor layer. Such a solution is conventionally considered an effective solution.

By contrast, through the development of the semiconductor device configured as above, the inventors discovered that there are cases in which the occurrence of a mounting failure due to the warp in a semiconductor device does not become a series problem if the semiconductor device configured as above satisfies a specific condition such as the case where a difference between the length in a longitudinal direction and the length in a lateral direction in a plan view is relatively small.

Then, the inventors found that in the above case, the necessity for matching the longitudinal direction of the semiconductor device and the longitudinal direction of obround pads in a plan view of the semiconductor device to suppress the occurrence of a mounting failure is relatively low.

Moreover, the inventors found the following: in the case where the obround pads are formed on the surface of the semiconductor device, as long as the semiconductor device has the same shape, when in the plan view of the semiconductor device, the longitudinal direction of the semiconductor device is orthogonal to the longitudinal direction of the obround pads, the area occupancy of the obround pads can be increased, that is, the continuity resistance of a current path in the semiconductor device can be decreased compared with when in the plan view of the semiconductor device, the longitudinal direction of the semiconductor device matches the longitudinal direction of the obround pads.

Then, the inventors repeated experiments and analysis on the basis of the findings and finally arrived at the semiconductor device according to the present disclosure.

A semiconductor device according to the present disclosure is a facedown mountable, chip-size-package type semiconductor device. The semiconductor device includes: a semiconductor layer; a metal layer provided in contact with a back surface of the semiconductor layer; a first vertical metal-oxide-semiconductor (MOS) transistor provided in a first area of the semiconductor layer; a second vertical MOS transistor provided in a second area of the semiconductor layer, the second area being adjacent to the first area in a plan view of the semiconductor device; a first gate pad and 2n+1 first source pads of the first vertical MOS transistor that are provided at positions within the first area in the plan view, on a top surface of the semiconductor device, n being an integer greater than or equal to 1; and a second gate pad and $2n+1$ second source pads of the second vertical MOS transistor that are provided at positions within the second area in the plan view, on the top surface of the semiconductor device. On a same side as the back surface, the semiconductor layer includes a semiconductor substrate that is a common drain region shared by the first vertical MOS transistor and the second vertical MOS transistor. In the plan view, the semiconductor layer has a shape of a rectangle having a first side, a second side, a third side, and a fourth side, the first side and the second side extending in a first direction and having an equal length, the third side and the fourth side extending in a second direction orthogonal to the first direction and having an equal length that is a length less than or equal to the equal length of the first side and the second side, the first area and the second area are one and another of two equal halves of an area of the semiconductor layer, the third side is included in a perimeter of the first area, and the fourth side is included in a perimeter of the second area, a boundary line between the first area and the second area is crank-shaped by connecting an entirety of a third segment, an entirety of a first segment, an entirety of a fourth segment, an entirety of a second segment, and an entirety of a fifth segment in order stated, from one end of the boundary line toward another end of the boundary line, the first segment and the second segment extending in a straight line in the first direction, the third segment, the fourth segment, and the fifth segment extending in a straight line in the second direction, the boundary line monotonously changing in the first direction and the second direction from the one end toward the other end, a length of the first segment is equal to a length of the second segment, a length of the third segment is equal to a length of the fifth segment, the one end of the boundary line is on the first side, and the other end of the boundary line is on the second side, the fourth segment is on a virtual center line of the semiconductor layer that divides the area of the semiconductor layer into two equal halves in the plan view and extends in a straight line in the second direction, the first gate pad is circular, a center of the first gate pad is on the virtual center line, and no other pads are present between the first gate pad and the second side, the second gate pad is circular and has a diameter identical to a diameter of the first gate pad, a center of the second gate pad is on the virtual center line, and no other pads are present between the second gate pad and the first side, the $2n+1$ first source pads and the $2n+1$ second source pads each have a shape of an obround whose longitudinal direction matches the second direction, and the $2n+1$ first source pads and the $2n+1$ second source pads have an equal width in a lateral direction, the $2n+1$ first source pads include a first closest source pad closest to the fourth segment and $2n$ first non-closest source pads not closest to the fourth segment, the first closest source pad is so disposed that an axis of line symmetry, extending in the longitudinal direction, of the first closest source pad matches a first closest equal-interval line closest to the fourth segment among $n+1$ first equal-interval lines that are virtual lines extending in the second direction in the first area and arranged at equal intervals in the first direction, the $2n$ first non-closest source pads are so disposed that with regard to each of $n$ first non-closest equal-interval lines that are lines except the first closest equal-interval line included in the $n+1$ first equal-interval lines, axes of line symmetry, extending in the longitudinal direction, of two first non-closest source pads among the $2n$ first non-closest source pads match the first non-closest equal-interval line, the $2n+1$ second source pads include a second closest source pad closest to the fourth segment and $2n$ second non-closest source pads not closest to the fourth segment, the second closest source pad is so disposed that an axis of line symmetry, extending in the longitudinal direction, of the second closest source pad matches a second closest equal-interval line closest to the fourth segment among $n+1$ second equal-interval lines that are virtual lines extending in the second direction in the second area and arranged at equal intervals in the first direction, the $2n$ second non-closest source pads are so disposed that with regard to each of $n$ second non-closest equal-interval lines that are lines except the second closest equal-interval line included in the $n+1$ second equal-interval lines, axes of line symmetry, extending in the longitudinal direction, of two second non-closest source pads among the $2n$ second non-closest source pads match the second non-closest equal-interval line, and the $2n+1$ first source pads and the $2n+1$ second source pads are symmetrical with respect to the virtual center line as an axis of line symmetry.

In the semiconductor device configured as above, in the plan view of the semiconductor device, the longitudinal direction of the semiconductor device is orthogonal to the longitudinal direction of the $2n+1$ first source pads and the $2n+1$ second source pads.

Thus, the area occupancy of the $2n+1$ first source pads and the area occupancy of the $2n+1$ second source pads can be made higher, in comparison with the configuration where in the plan view of the semiconductor device, the longitudinal direction of the semiconductor device matches the longitudinal direction of the $2n+1$ first source pads and the $2n+1$ second source pads.

Accordingly, in the semiconductor device configured as above, it is possible to decrease the continuity resistance of the current path of a current flowing between the $2n+1$ first source pads and the $2n+1$ second source pads, in comparison with the configuration where in the plan view of the semiconductor device, the longitudinal direction of the semiconductor device matches the longitudinal direction of the $2n+1$ first source pads and the $2n+1$ second source pads.

Moreover, the semiconductor device configured as above includes a metal layer whose specific electrical resistance is generally lower than that of the semiconductor layer, and that serves as a part of the current path of a current flowing between the first vertical MOS transistor and the second vertical MOS transistor.

Accordingly, in the semiconductor device configured as above, it is possible to decrease the continuity resistance of the current path of the current flowing between the $2n+1$ first source pads and the $2n+1$ second source pads.

Moreover, in the semiconductor device configured as above, in the plan view of the semiconductor device, the first gate pad can be disposed as close, in terms of a design rule, as possible to the second side at the middle position of the second side of the semiconductor device in the first direction. Furthermore, the second gate pad can be disposed as close, in terms of the design rule, as possible to the first side at the middle position of the first side of the semiconductor device in the first direction.

In this way, it is possible to suppress the first gate pad and the second gate pad from becoming disturbances to the current path of the current flowing between the $2n+1$ first source pads and the $2n+1$ second source pads.

Accordingly, in the semiconductor device configured as above, it is possible to decrease the continuity resistance of the current path of the current flowing between the 2n+1 first source pads and the 2n+1 second source pads.

It should be noted that in the specification of the present application, the center/middle in a plan view is used as follows. For a structure having a rectangular shape in a plan view as with, for example, the semiconductor device, the intersection point of the diagonal lines of the rectangular is referred to as the center/middle. For a structure having a circular shape in a plan view as with, for example, the gate pads, the center of the circle is referred to as the center. For a structure having an obround shape in a plan view as with, for example, the source pads, the intersection point of the axis of line symmetry of the obround in a longitudinal direction and the axis of line symmetry of the obround in a lateral direction is referred to as the middle. For a structure having an oval shape in a plan view, the intersection point of the major axis and the minor axis of the oval is referred to as the middle.

Moreover, in the semiconductor device configured as above, in the plan view of the semiconductor device, two first non-closest source pads are disposed on each first non-closest equal-interval line, and two second non-closest source pads are disposed on each second non-closest equal-interval line.

Accordingly, in the semiconductor device configured as above, it is possible to better suppress the occurrence of a mounting failure due to the warp of the semiconductor device, in comparison with the configuration where in the plan view of the semiconductor device, one first non-closest source pad is disposed on each first non-closest equal-interval line, and one second non-closest source pad is disposed on each second non-closest equal-interval line. This is because the less the length in the longitudinal direction per first non-closest source pad, the occurrence frequency of mounting failure is decreased, and the less the length in the longitudinal direction per second non-closest source pad, the occurrence frequency of mounting failure is decreased.

In this way, the semiconductor device configured as above is a semiconductor device that can suppress the occurrence of a mounting failure in mounting the semiconductor device onto a mount substrate, in addition to having features suitable for decreasing the continuity resistance of the current path of the mount substrate for mounting the semiconductor device.

Moreover, in the plan view, a length of the first closest source pad in the longitudinal direction may be more than a length of each of the 2n first non-closest source pads in the longitudinal direction, and a length of the second closest source pad in the longitudinal direction may be more than a length of each of the 2n second non-closest source pads in the longitudinal direction.

In this way, in the semiconductor device configured as above, in the plan view of the semiconductor device, the first closest source pad and the second closest source pad are disposed closest to the fourth segment with the highest current density in the current path of the current flowing between the first vertical MOS transistor and the second vertical MOS transistor. Here, the first closest source pad is the largest first source pad among the 2n+1 first source pads, and the second closest source pad is the largest second source pad among the 2n+1 second source pads.

Accordingly, in the semiconductor device configured as above, it is possible to decrease the continuity resistance of the current path of the current flowing between the 2n+1 first source pads and the 2n+1 second source pads.

Moreover, in the plan view, (i) a closest distance between the two first non-closest source pads whose axes of line symmetry extending in the longitudinal direction match a corresponding one of the n first non-closest equal-interval lines in the plan view and (ii) a closest distance between the two second non-closest source pads whose axes of line symmetry extending in the longitudinal direction match a corresponding one of the n second non-closest equal-interval lines in the plan view may be less than the diameter of the first gate pad and the diameter of the second gate pad.

In this way, in the plan view of the semiconductor device, it is possible to suppress a decrease in the area occupancy of the 2n first non-closest source pads due to the provision of two first non-closest source pads on each first non-closest equal-interval line with a space between the two pads and a decrease in the area occupancy of the 2n second non-closest source pads due to the provision of two second non-closest source pads on each second non-closest equal-interval line with a space between the two pads.

Moreover, in the plan view, (i) a middle point of a virtual segment connecting closest points on perimeters of the two first non-closest source pads whose axes of line symmetry extending in the longitudinal direction match a corresponding one of the n first non-closest equal-interval lines in the plan view, (ii) a middle point of a virtual segment connecting closest points on perimeters of the two second non-closest source pads whose axes of line symmetry extending in the longitudinal direction match a corresponding one of the n second non-closest equal-interval lines in the plan view, (iii) a middle of the first closest source pad, and (iv) a middle of the second closest source pad may be on a straight line extending in the first direction.

Moreover, in the plan view, a closest distance between the first side and a first non-closest source pad that is closer to the first side among the two first non-closest source pads whose axes of line symmetry extending in the longitudinal direction match the corresponding one of the n first non-closest equal-interval lines in the plan view may be less than a closest distance between the first side and the first closest source pad, a closest distance between the second side and a first non-closest source pad that is closer to the second side among the two first non-closest source pads whose axes of line symmetry extending in the longitudinal direction match the corresponding one of the n first non-closest equal-interval lines in the plan view may be less than a closest distance between the second side and the first closest source pad, a closest distance between the first side and a second non-closest source pad that is closer to the first side among the two second non-closest source pads whose axes of line symmetry extending in the longitudinal direction match the corresponding one of the n second non-closest equal-interval lines in the plan view may be less than a closest distance between the first side and the second closest source pad, and a closest distance between the second side and a second non-closest source pad that is closer to the second side among the two second non-closest source pads whose axes of line symmetry extending in the longitudinal direction match the corresponding one of the n second non-closest equal-interval lines in the plan view may be less than a closest distance between the second side and the second closest source pad.

In this way, it is possible to suppress a decrease in the area occupancy of the 2n first non-closest source pads and a decrease in the area occupancy of the 2n second non-closest source pads.

Moreover, in the plan view, a distance between the first side and a middle of a first non-closest source pad that is closer to the first side among the two first non-closest source pads whose axes of line symmetry extending in the longitudinal direction match the corresponding one of the n first non-closest equal-interval lines in the plan view may be more than a closest distance between the first side and the first closest source pad, a distance between the second side and a middle of a first non-closest source pad that is closer to the second side among the two first non-closest source pads whose axes of line symmetry extending in the longitudinal direction match the corresponding one of the n first non-closest equal-interval lines in the plan view may be more than a closest distance between the second side and the first closest source pad, a distance between the first side and a middle of a second non-closest source pad that is closer to the first side among the two second non-closest source pads whose axes of line symmetry extending in the longitudinal direction match the corresponding one of the n second non-closest equal-interval lines in the plan view may be more than a closest distance between the first side and the second closest source pad, and a distance between the second side and a middle of a second non-closest source pad that is closer to the second side among the two second non-closest source pads whose axes of line symmetry extending in the longitudinal direction match the corresponding one of the n second non-closest equal-interval lines in the plan view may be more than a closest distance between the second side and the second closest source pad.

Moreover, in the plan view, a closest distance between the first closest source pad and the fourth segment may be less than a closest distance, in the first direction, between two first source pads adjacent to each other in the first direction among the 2n+1 first source pads, and a closest distance between the second closest source pad and the fourth segment may be less than a closest distance, in the first direction, between two second source pads adjacent to each other in the first direction among the 2n+1 second source pads.

Moreover, in the plan view, when a first length of the semiconductor layer in the first direction is defined as Lx, a second length of the semiconductor layer in the second direction is defined as Ly, and the diameter of the first gate pad and the diameter of the second gate pad are defined as d, the following expressions may hold.

$Ly \leq 14 \times d$ $Lx \leq Ly + 2 \times d$

In this way, in the plan view of the semiconductor device, the semiconductor device has a rectangular shape relatively close to a square. Thus, the degree of warp that may occur in the semiconductor device in a high-temperature environment is relatively small.

Accordingly, in the semiconductor device configured as above, it is possible to suppress the occurrence of a mounting failure in mounting the semiconductor device onto the mount substrate.

Moreover, n may equal 3, and in the plan view, the equal width of the 2n+1 first source pads and the 2n+1 second source pads may be less than the diameter of the first gate pad and the diameter of the second gate pad.

Hereinafter, a specific example of a semiconductor device according to one aspect of the present disclosure is described with reference to the figures. The embodiment described herein indicates a specific example of the present disclosure. Accordingly, the numerical values, shapes, constituent elements, arrangement and connection of the constituent elements, as well as steps (processes), the order of the steps, and other details indicated in the following embodiment are merely examples, and do not intend to limit the present disclosure. Moreover, the figures are schematic illustrations and are not necessarily precise depictions. In the figures, substantially the same elements are assigned the same reference signs, and overlapping explanations are omitted or simplified.

EMBODIMENT

Hereinafter, a semiconductor device according to an embodiment is described. The semiconductor device is a facedown mountable, chip-size-package type semiconductor device that includes two vertical metal-oxide-semiconductor (MOS) transistors.

<Structure of Semiconductor Device>

FIG. 1 is a plan view illustrating an example of a structure of semiconductor device 1 according to the embodiment. As illustrated in FIG. 1, in a plan view of semiconductor device 1, semiconductor device 1 has a shape of a rectangle having first side 71, second side 72, third side 73, and fourth side 74. Here, first side 71 and second side 72 extend in a first direction (the X-axis direction in FIG. 1) and have an equal length, and third side 73 and fourth side 74 extend in a second direction (the Y-axis direction in FIG. 1) orthogonal to the first direction and have an equal length that is a length less than or equal to the length of first side 71 and second side 72.

It should be noted that in FIG. 1, the perimeter of portion 13 (described later) of first source electrode 11 (not illustrated in FIG. 1 and described later) in the plan view of semiconductor device 1 and the perimeter of portion 23 (described later) of second source electrode 21 (not illustrated in FIG. 1 and described later) in the plan view of semiconductor device 1 are indicated by the dashed lines as if it were possible to view the perimeters. However, in reality, it is not possible to directly view the perimeters of the portions from outside of semiconductor device 1.

Figure 2:
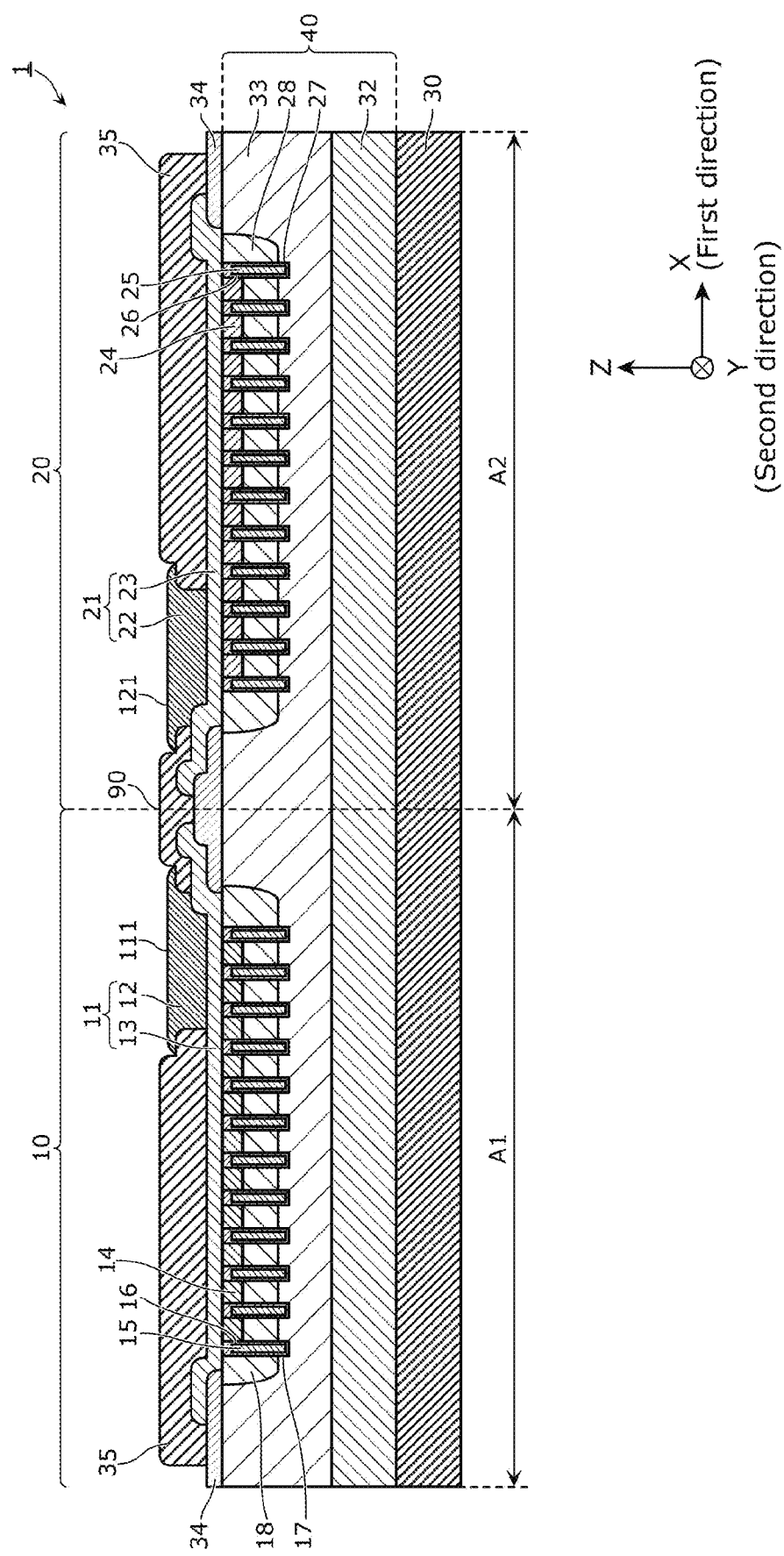
FIG. 2 is a cross-sectional view illustrating an example of the structure of the semiconductor device according to the embodiment.

FIG. 2 is a cross-sectional view illustrating an example of the structure of semiconductor device 1 and a cross section taken along II-II in FIG. 1.

Figure 3:
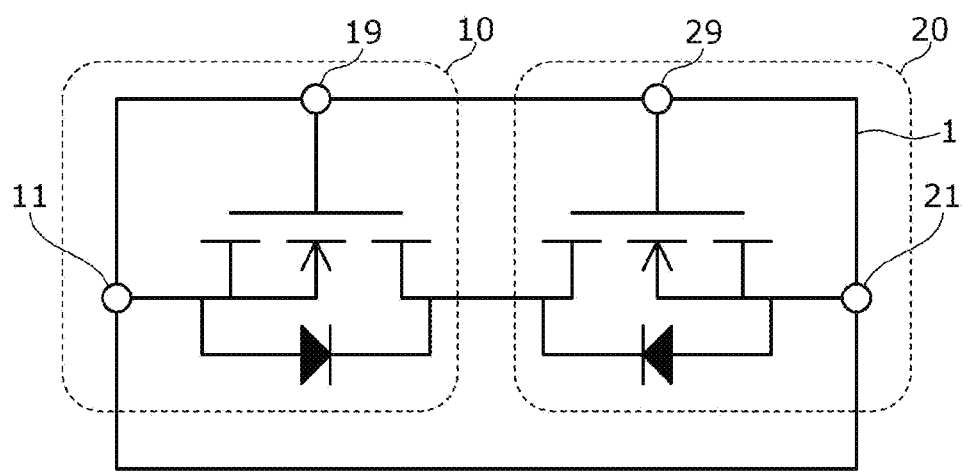
FIG. 3 is a circuit diagram of the semiconductor device according to the embodiment.

FIG. 3 is a circuit diagram of semiconductor device 1.

As illustrated in FIGS. 1 to 3, semiconductor device 1 includes semiconductor layer 40, metal layer 30, interlayer insulation layer 34, passivation layer 35, first vertical MOS transistor 10, and second vertical MOS transistor 20. Here, first vertical MOS transistor 10 is provided in first area A1 of semiconductor layer 40, and second vertical MOS transistor 20 is provided in second area A2 of semiconductor layer 40 which is the area adjacent to first area A1 in the plan view of semiconductor device 1.

Here, in the plan view of semiconductor device 1, first area A1 and second area A2 are one and the other of the two equal halves of the area of semiconductor layer 40, third side 73 is included in the perimeter of first area A1, and fourth side 74 is included in the perimeter of second area A2.

In the plan view of semiconductor device 1, boundary line 90 between first area A1 and second area A2 is crank-shaped by connecting the entirety of third segment 93, the entirety of first segment 91, the entirety of fourth segment 94, the entirety of second segment 92, and the entirety of fifth segment 95 in the order stated, from end 61 that is one end of boundary line 90 toward end 62 that is the other end of boundary line 90. Here, first segment 91 and second segment 92 extend in a straight line in the first direction, and third segment 93, fourth segment 94, and fifth segment 95 extend in a straight line in the second direction. Boundary line 90 monotonously changes in the first direction and the second direction from end 61, which is the one end of boundary line 90, toward end 62, which is the other end of boundary line 90.

In the specification, the boundary line being crank-shaped means that the segments extending in a straight line in the first direction and the segments extending in a straight line in the second direction are alternately connected in such a way that the boundary line monotonously changes in the first direction and the second direction.

Moreover, in the specification, monotonous change means a monotonously increasing function in a broad sense or a monotonously decreasing function in a broad sense. That is, the monotonously increasing function in a broad sense means that when x1<x2, function f(x) gives f(x1)≤f(x2), and the monotonously decreasing function in a broad sense means that when x1<x2, function f(x) gives f(x1)≥f(x2).

Here, in the plan view of semiconductor device 1, (1) first segment 91 and second segment 92 are equal in length, (2) third segment 93 and fifth segment 95 are equal in length, (3) end 61, which is the one end of boundary line 90, is on first side 71, (4) end 62, which is the other end of boundary line 90, is on second side 72, and (5) fourth segment 94 is on virtual center line 80 of semiconductor layer 40 that divides the area of semiconductor layer 40 into two equal halves in the plan view of semiconductor device 1 and extends in a straight line in the second direction.

Moreover, semiconductor device 1 includes 2n+1 first source pads 111 (n is an integer greater than or equal to 1, and n=3 in FIG. 1) and first gate pad 119 of first vertical MOS transistor 10 that are provided at positions within first area A1 in the plan view of semiconductor device 1. Here, 2n+1 first source pads 111 correspond to first source pads 111*a* to 111*g* in FIG. 1. Hereinafter, if there is no need to explicitly distinguish each individual pad, first source pads 111*a* to 111*g* are also simply referred to as first source pads 111. Semiconductor device 1 includes 2n+1 second source pads 121 and second gate pad 129 of second vertical MOS transistor 20 that are provided at positions within second area A2 in the plan view of semiconductor device 1. Here, 2n+1 second source pads 121 correspond to second source pads 121*a* to 121*g* in FIG. 1. Hereinafter, if there is no need to explicitly distinguish each individual pad, second source pads 121*a* to 121*g* are also simply referred to as second source pads 121.

In the plan view of semiconductor device 1, (1) first gate pad 119 is circular, (2) the center of first gate pad 119 is on center line 80, (3) no other pads are present between first gate pad 119 and second side 72, (4) second gate pad 129 is circular and has the same diameter as first gate pad 119, (5) the center of second gate pad 129 is on center line 80, and (6) no other pads are present between second gate pad 129 and first side 71.

In the plan view of semiconductor device 1, (1) 2n+1 first source pads 111 and 2n+1 second source pads 121 each have a shape of an obround whose longitudinal direction matches the second direction, (2) 2n+1 first source pads 111 and 2n+1 second source pads 121 have an equal width in a lateral direction, (3) 2n+1 first source pads 111 include first closest source pad 111*a* that is closest to fourth segment 94 and 2n first non-closest source pads 111*b* to 111*g* that are not closest to fourth segment 94 (hereinafter, if there is no need to explicitly distinguish each individual pad, first non-closest source pads 111*b* to 111*g* are also simply referred to as first non-closest source pads 111*bg*), and (4) 2n+1 second source pads 121 include second closest source pad 121*a* that is closest to fourth segment 94 and 2n second non-closest source pads 121*b* to 121*g* that are not closest to fourth segment 94 (hereinafter, if there is no need to explicitly distinguish each individual pad, second non-closest source pads 121*b* to 121*g* are also simply referred to as second non-closest source pads 121*bg*).

Here, in the plan view of semiconductor device 1, (1) first closest source pad 111*a* is so disposed that the axis of line symmetry, extending in the longitudinal direction, of first closest source pad 111*a* matches first closest equal-interval line 81*a* that is closest to fourth segment 94 among n+1 first equal-interval lines 81*a* to 81*d* that are virtual lines extending in the second direction in first area A1 and arranged at equal intervals in the first direction, and (2) 2n first non-closest source pads 111*bg* are so disposed that with regard to each of n first non-closest equal-interval lines 81*b* to 81*d* (hereinafter, if there is no need to explicitly distinguish each individual line, first non-closest equal-interval lines 81*b* to 81*d* are also simply referred to as first non-closest equal-interval lines 81*bd*) that are the lines except first closest equal-interval line 81*a* included in n+1 first equal-interval lines 81*a* to 81*d*, the axes of line symmetry, extending in the longitudinal direction, of two first non-closest source pads 111*bg* match corresponding first non-closest equal-interval line 81*bd*. That is, first source pads 111 are arranged in stripes in the plan view of semiconductor device 1.

Moreover, in the plan view of semiconductor device 1, (1) second closest source pad 121*a* is so disposed that the axis of line symmetry, extending in the longitudinal direction, of second closest source pad 121*a* matches second closest equal-interval line 82*a* that is closest to fourth segment 94 among n+1 second equal-interval lines 82*a* to 82*d* that are virtual lines extending in the second direction in second area A2 and arranged at equal intervals in the first direction, and (2) 2n second non-closest source pads 121*bg* are so disposed that with regard to each of n second non-closest equal-interval lines 82*b* to 82*d* that are the lines except second closest equal-interval line 82*a* included in n+1 second equal-interval lines 82*a* to 82*d* (hereinafter, if there is no need to explicitly distinguish each individual line, second non-closest equal-interval lines 82*b* to 82*d* are also simply referred to as second non-closest equal-interval lines 82*bd*), the axes of line symmetry, extending in the longitudinal direction, of two second non-closest source pads 121*bg* match corresponding second non-closest equal-interval line 82*bd*. That is, second source pads 121 are arranged in stripes in the plan view of semiconductor device 1.

Here, in the plan view of semiconductor device 1, (1) the length of first closest source pad 111*a* in the longitudinal direction may be more than that of each of 2n first non-closest source pads 111*bg* in the longitudinal direction, and (2) the length of second closest source pad 121*a* may be more than that of each of 2n second non-closest source pads 121*bg* in the longitudinal direction.

In this way, in the plan view of semiconductor device 1, first closest source pad 111*a* and second closest source pad 121*a* are disposed closest to fourth segment 94 with the highest current density in the current path of a current flowing between first vertical MOS transistor 10 and second vertical MOS transistor 20. Here, first closest source pad 111*a* is largest first source pad 111 among 2n+1 first source pads 111, and second closest source pad 121*a* is largest second source pad 121 among 2n+1 second source pads 121.

Accordingly, it is possible to decrease the continuity resistance of the current path of a current flowing between 2n+1 first source pads 111 and 2n+1 second source pads 121.

Moreover, in the plan view of semiconductor device 1, 2n+1 first source pads 111 and 2n+1 second source pads 121 are symmetrical with respect to center line 80 as the axis of line symmetry.

It should be noted that as illustrated in FIG. 1, in the plan view of semiconductor device 1, (i) the closest distance between two first non-closest source pads 111*bg* whose axes of line symmetry extending in the longitudinal direction match a corresponding one of n first non-closest equal-interval line 81*bd* in the plan view of semiconductor device 1 and (ii) the closest distance between two second non-closest source pads 121*bg* whose axes of line symmetry extending in the longitudinal direction match a corresponding one of n second non-closest equal-interval lines 82*bd* in the plan view of semiconductor device 1 may be less than the diameter of first gate pad 119 and the diameter of second gate pad 129.

In this way, in the plan view of semiconductor device 1, it is possible to suppress a decrease in the area occupancy of 2n first non-closest source pads 111*bg* due to the provision of two first non-closest source pads 111*bg* on each first non-closest equal-interval line 81*bd* with a space between the pads and a decrease in the area occupancy of 2n second non-closest source pads 121*bg* due to the provision of two second non-closest source pads 121*bg* on each second non-closest equal-interval line 82*bd* with a space between the pads.

Moreover, as illustrated in FIG. 1, in the plan view of semiconductor device 1, (i) the middle point of a virtual segment connecting the closest points on the perimeters of two first non-closest source pads 111*bg* whose axes of line symmetry extending in the longitudinal direction match a corresponding one of n first non-closest equal-interval lines 81*bd* in the plan view of semiconductor device 1, (ii) the middle point of a virtual segment connecting the closest points on the perimeters of two second non-closest source pads 121*bg* whose axes of line symmetry extending in the longitudinal direction match a corresponding one of n second non-closest equal-interval lines 82*bd* in the plan view of semiconductor device 1, (iii) middle 111*a*1 of first closest source pad 111*a*, and (iv) middle 121*a*1 of second closest source pad 121*a* may be on a straight line extending in the first direction.

Moreover, as illustrated in FIG. 1, in the plan view of semiconductor device 1, (1) the closest distance between first side 71 and first non-closest source pad 111*bg* closer to first side 71 among two first non-closest source pads 111*bg* whose axes of line symmetry extending in the longitudinal direction match a corresponding one of n first non-closest equal-interval lines 81*bd* in the plan view of semiconductor device 1 may be less than the closest distance between first side 71 and first closest source pad 111*a*, (2) the closest distance between second side 72 and first non-closest source pad 111*bg* closer to second side 72 among two first non-closest source pads 111*bg* whose axes of line symmetry extending in the longitudinal direction match a corresponding one of n first non-closest equal-interval lines 81*bd* in the plan view of semiconductor device 1 may be less than the closest distance between second side 72 and first closest source pad 111*a*, (3) the closest distance between first side 71 and second non-closest source pad 121*bg* closer to first side 71 among two second non-closest source pads 121*bg* whose axes of line symmetry extending in the longitudinal direction match a corresponding one of n second non-closest equal-interval lines 82*bd* in the plan view of semiconductor device 1 may be less than the closest distance between first side 71 and second closest source pad 121*a*, and (4) the closest distance between second side 72 and second non-closest source pad 121*bg* closer to second side 72 among two second non-closest source pads 121*bg* whose axes of line symmetry extending in the longitudinal direction match a corresponding one of n second non-closest equal-interval lines 82*bd* in the plan view of semiconductor device 1 may be less than the closest distance between second side 72 and second closest source pad 121*a*.

In this way, it is possible to suppress a decrease in the area occupancy of 2n first non-closest source pads 111*bg* and a decrease in the area occupancy of 2n second non-closest source pads 121*bg*.

It should be noted that not one but two first non-closest source pads 111*bg* whose axes of line symmetry extending in the longitudinal direction match a corresponding one of first non-closest equal-interval lines 81*bd* in the plan view of semiconductor device 1 are provided, and not one but two second non-closest source pads 121*bg* whose axes of line symmetry extending in the longitudinal direction match a corresponding one of second non-closest equal-interval lines 82*bd* in the plan view of semiconductor device 1 are provided. This is because the longer the length per source pad in first non-closest source pads 111*bg* and second non-closest source pads 121*bg*, the higher the occurrence frequency of mounting failure.

Moreover, (i) the position, in the second direction, of the middle point of the virtual segment connecting the closest points on the perimeters of two first non-closest source pads 111*bg* whose axes of line symmetry extending in the longitudinal direction match a corresponding one of first non-closest equal-interval lines 81*bd* in the plan view of semiconductor device 1 and (ii) the position, in the second direction, of the middle point of the virtual segment connecting the closest points on the perimeters of two second non-closest source pads 121*bg* whose axes of line symmetry extending in the longitudinal direction match a corresponding one of second non-closest equal-interval lines 82*bd* in the plan view of semiconductor device 1 match the position of middle 111*a*1 of first closest source pad 111*a* in the second direction and the position of middle 121*a*1 of second closest source pad 121*a* in the second direction. This is because by doing so, each of first non-closest source pads 111*bg* and second non-closest source pads 121*bg* can be provided up to a position close to first side 71 or second side 72.

Moreover, as illustrated in FIG. 1, in the plan view of semiconductor device 1, (1) the distance between first side 71 and the middle of first non-closest source pad 111*bg* (corresponding to middle 111*c*1, middle 111*e*1, or middle 111*g*1 in FIG. 1) closer to first side 71 among two first non-closest source pads 111*bg* whose axes of line symmetry extending in the longitudinal direction match a corresponding one of n first non-closest equal-interval lines 81*bd* in the plan view of semiconductor device 1 may be more than the closest distance between first side 71 and first closest source pad 111*a*, (2) the distance between second side 72 and the middle of first non-closest source pad 111*bg* (corresponding to middle 111*b*1, middle 111*d*1, or middle 111*f*1 in FIG. 1) closer to second side 72 among two first non-closest source pads 111*bg* whose axes of line symmetry extending in the longitudinal direction match a corresponding one of n first non-closest equal-interval lines 81*bd* in the plan view of semiconductor device 1 may be more than the closest distance between second side 72 and first closest source pad 111*a*, (3) the distance between first side 71 and the middle of second non-closest source pad 121*bg* (corresponding to middle 121*c*1, middle 121*e*1, or middle 121*g*1 in FIG. 1)

closer to first side 71 among two second non-closest source pads 121*bg* whose axes of line symmetry extending in the longitudinal direction match a corresponding one of n second non-closest equal-interval lines 82*bd* in the plan view of semiconductor device 1 may be more than the closest distance between first side 71 and second closest source pad 121*a*, and (4) the distance between second side 72 and the middle of second non-closest source pad 121*bg* (corresponding to middle 121*b*1, middle 121*d*1, or middle 121*f*1 in FIG. 1) closer to second side 72 among two second non-closest source pads 121*bg* whose axes of line symmetry extending in the longitudinal direction match a corresponding one of n second non-closest equal-interval lines 82*bd* in the plan view of semiconductor device 1 may be more than the closest distance between second side 72 and second closest source pad 121*a*.

Moreover, as illustrated in FIG. 1, in the plan view of semiconductor device 1, (1) the closest distance between first closest source pad 111*a* and fourth segment 94 may be less than the closest distance, in the first direction, between two first source pads 111 adjacent to each other in the first direction among 2n+1 first source pads 111, and (2) the closest distance between second closest source pad 121*a* and fourth segment 94 may be less than the closest distance, in the first direction, between two second source pads 121 adjacent to each other in the first direction among 2n+1 second source pads 121.

Moreover, in the plan view of semiconductor device 1, when the first length of semiconductor layer 40 in the first direction is defined as Lx, the second length of semiconductor layer 40 in the second direction is defined as Ly, and the diameters of first gate pad 119 and second gate pad 129 are defined as d, the following expressions may hold.

$$Ly \leq 14 \times d$$

$$Lx \leq Ly + 2 \times d$$

In this way, in the plan view of semiconductor device 1, semiconductor device 1 has a rectangular shape relatively close to a square. Thus, the degree of warp that may occur in semiconductor device 1 in a high-temperature environment is relatively small.

Accordingly, in semiconductor device 1 configured as above, it is possible to suppress the occurrence of a mounting failure in mounting semiconductor device 1 onto a mount substrate.

It should be noted that in this case, as a typical shape of semiconductor device 1 in which d is 0.20 mm, the shape in which Ly is 2.0 mm and Lx ranges from 2.0 mm to 2.4 mm, inclusive or the shape in which Ly is 2.5 mm and Lx ranges 2.5 mm to 2.9 mm, inclusive is considered, for example.

Moreover, in this case, as a typical shape of semiconductor device 1 in which d is 0.25 mm, the shape in which Ly is 2.0 mm and Lx ranges from 2.0 mm to 2.5 mm, inclusive, the shape in which Ly is 2.5 mm and Lx ranges 2.5 mm to 3.0 mm, inclusive, or the shape in which Ly is 3.0 mm and Lx ranges from 3.0 mm to 3.5 mm, inclusive is considered, for example.

It should be noted that the reasons why Ly is less than or equal to 14×d are indicated below. Through, for example, the experiments and simulations previously conducted by the inventors, the following is demonstrated: the occurrence of a mounting failure is suppressed as long as the lengths of first closest source pad 111*a* and second closest source pad 121*a* in the longitudinal direction are up to the eight times the diameter of each of first gate pad 119 and second gate pad 129. In addition, each of the closest distance between first gate pad 119 and second side 72 in the second direction, the shortest distance between first gate pad 119 and first closest source pad 111*a* in the second direction, the closest distance between second gate pad 129 and first side 71 in the second direction, and the shortest distance between second gate pad 129 and second closest source pad 121*a* in the second direction is regarded as the diameter of each of first gate pad 119 and second gate pad 129.

Moreover, the reason why Lx is less than or equal to Ly+2d is that through, for example, the experiments and simulations previously conducted by the inventors, the following is demonstrated: with the upper limit of Lx being longer than Ly by at most the two diameters of first gate pad 119 and second gate pad 129, the degree of warp that may occur in semiconductor device 1 will be within the range in which the warp does not have serious effects on the occurrence of a mounting failure.

Moreover, as illustrated in FIG. 1, n equals 3, and in the plan view of semiconductor device 1, the width of each of 2n+1 first source pads 111 and 2n+1 second source pads 121 may be less than the diameter of first gate pad 119 and the diameter of second gate pad 129.

However, as long as n is an integer greater than or equal to 2, n need not be limited to 3. For instance, n may be 2 or an integer greater than or equal to 4.

Figure 4:
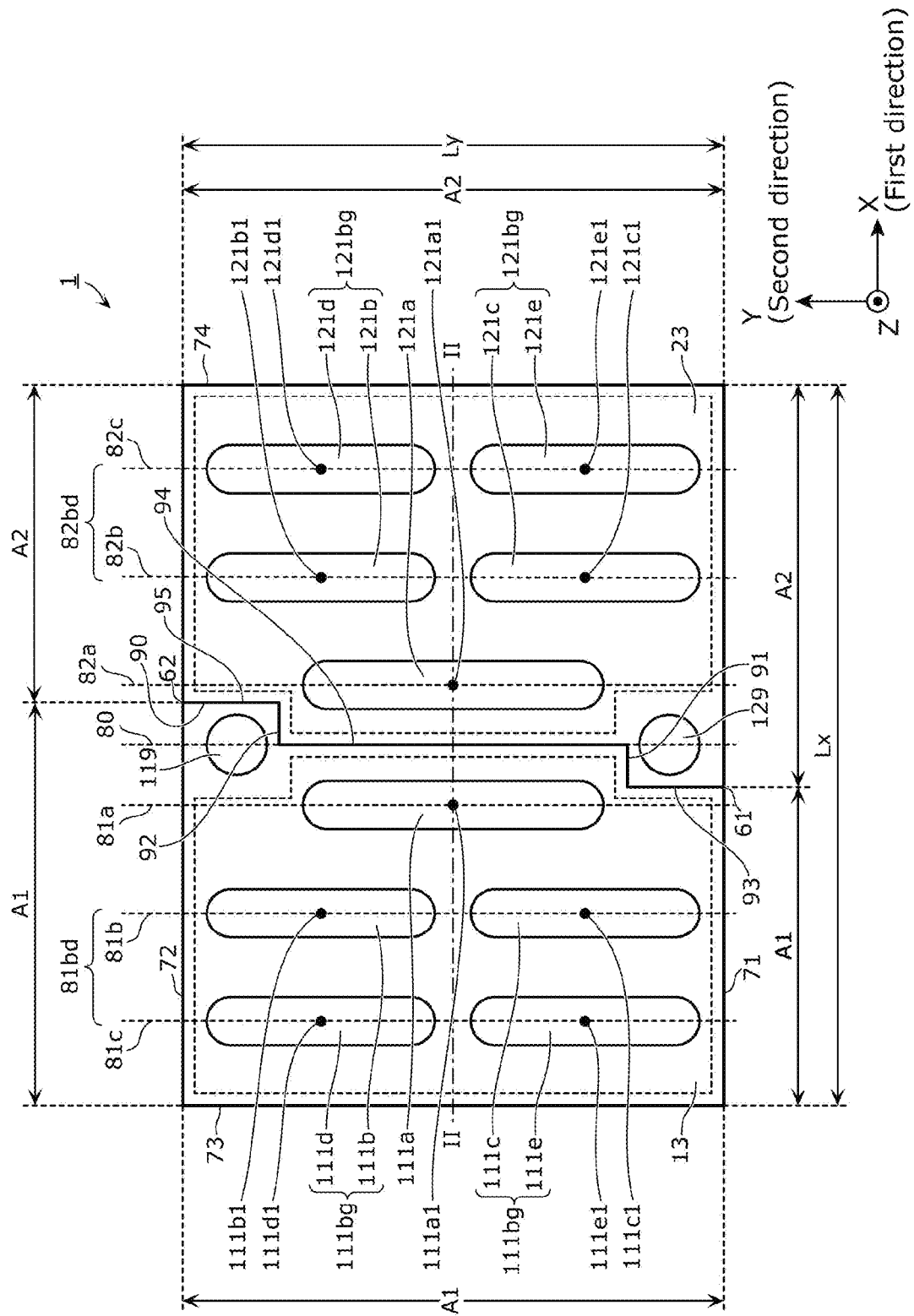
FIG. 4 is a plan view illustrating another example of the structure of the semiconductor device according to the embodiment.

FIG. 4 is a plan view illustrating an example of a structure of semiconductor device 1 when n equals 2.

We will return to FIGS. 1 to 3 and continue to describe the structure of semiconductor device 1.

Semiconductor layer 40 is configured by stacking semiconductor substrate 32 and low-concentration impurity layer 33 on top of each other.

Semiconductor substrate 32 is disposed on the same side as the back surface of semiconductor layer 40 and made of a first-conductivity-type silicon containing a first concentration of impurities.

Low-concentration impurity layer 33 is disposed on the same side as the front surface of semiconductor layer 40, is in contact with semiconductor substrate 32, and is made of a first-conductivity-type silicon containing a second concentration of impurities, the second concertation being lower than the first concentration. For instance, low-concentration impurity layer 33 may be epitaxially grown on semiconductor substrate 32.

Typically, semiconductor conductivity types include the two conductivity types: p-type and n-type. The first conductivity type may be p-type or n-type. Here, the first conductivity type is described as n-type, and a second conductivity type, which is described later, is described as p-type. However, the first conductivity type may be p-type, and the second conductivity type may be n-type.

In first area A1 of low-concentration impurity layer 33, first body region 18 containing impurities of the second conductivity type different from the first conductivity type extends from the top surface of semiconductor layer 40 up to a first predetermined depth.

In first body region 18, first source region 14 of the first conductivity type containing impurities extends from the top surface of semiconductor layer 40 up to a second predetermined depth that does not penetrate first body region 18.

Moreover, in first area A1 of low-concentration impurity layer 33, a plurality of gate trenches 17 each extending in the second direction extend from the top surface of semiconductor layer 40 and penetrate first source region 14 and first body region 18 up to a third predetermined depth that is the depth at a portion of low-concentration impurity layer 33.

Then, first gate conductor 15 surrounded by first gate insulator film 16 and extending in the second direction is provided inside each of the plurality of gate trenches 17.

First gate conductor 15 is electrically connected to first gate electrode 19.

As a non-limiting example, first gate conductor 15 may be polysilicon containing impurities.

In second area A2 of low-concentration impurity layer 33, second body region 28 containing impurities of the second conductivity type extends from the top surface of semiconductor layer 40 up to the first predetermined depth.

In second body region 28, second source region 24 of the first conductivity type containing impurities extends from the top surface of semiconductor layer 40 up to the second predetermined depth that does not penetrate second body region 28.

Moreover, in second area A2 of low-concentration impurity layer 33, a plurality of gate trenches 27 each extending in the second direction extend from the top surface of semiconductor layer 40 and penetrate second source region 24 and second body region 28 up to the third predetermined depth, which is the depth at the portion of low-concentration impurity layer 33.

Then, second gate conductor 25 surrounded by second gate insulator film 26 and extending in the second direction is provided inside each of the plurality of gate trenches 27.

Second gate conductor 25 is electrically connected to second gate electrode 29.

As a non-limiting example, second gate conductor 25 may be polysilicon containing impurities.

Because of the above configurations of first vertical MOS transistor 10 and second vertical MOS transistor 20, semiconductor substrate 32 functions as a common drain region where the first drain region of first vertical MOS transistor 10 and the second drain region of second vertical MOS transistor 20 serve as shared regions.

Metal layer 30 is in contact with the back surface of semiconductor layer 40, and contains silver or copper as a non-limiting example. It should be noted that metal layer 30 may contain trace elements, other than metal, that may get into the layer as impurities in the process of fabricating semiconductor device 1.

Interlayer insulation layer 34 is disposed on the top surface of semiconductor layer 40 and is in contact with low-concentration impurity layer 33.

Passivation layer 35 is a protective film covering the top surface of first vertical MOS transistor 10 and the top surface of second vertical MOS transistor 20. Passivation layer 35 includes 2n+1 openings for exposing 2n+1 first source pads 111 to outside of semiconductor device 1, an opening for exposing first gate pad 119 to outside of semiconductor device 1, 2n+1 openings for exposing 2n+1 second source pads 121 to outside of semiconductor device 1, and an opening for exposing second gate pad 129 to outside of semiconductor device 1.

Here, covering the top surface of first vertical MOS transistor 10 and the top surface of second vertical MOS transistor 20 with passivation layer 35 means a state in which passivation layer 35 is provided on almost the entire surface of semiconductor device 1 except for the openings in the plan view of semiconductor device 1. Here, almost the entire surface of semiconductor device 1 is the entire surface of semiconductor device 1 except the minute peripheral area that remains near the four sides of semiconductor device 1 after dicing, within a wafer area secured as a dicing margin in dicing a wafer and cutting semiconductor device 1 out from the wafer. Thus, at the peripheral area, interlayer insulation layer 34 is exposed as the top surface of semiconductor device 1 as an exception.

Moreover, the openings in passivation layer 35 in the present disclosure are shaped by the entire perimeters of the openings being surrounded by passivation layer 35 in the plan view of semiconductor device 1. Thus, in the plan view of semiconductor device 1, the shape in which a part of the perimeter of semiconductor device 1 overlaps the peripheral area in which interlayer insulation layer 34 is exposed as the top surface of semiconductor device 1 as an exception is not an opening of passivation layer 35 in the present disclosure.

Moreover, semiconductor device 1 includes, at positions within first area A1 in the plan view of semiconductor device 1, first source electrode 11 functioning as the source electrode of first vertical MOS transistor 10 and first gate electrode 19 (not illustrated in FIG. 2) functioning as the gate electrode of first vertical MOS transistor 10. Semiconductor device 1 includes, at positions within second area A2 in the plan view of semiconductor device 1, second source electrode 21 functioning as the source electrode of second vertical MOS transistor 20 and second gate electrode 29 (not illustrated in FIG. 2) functioning as the gate electrode of second vertical MOS transistor 20.

First source electrode 11 includes portion 12 and portion 13, and portion 12 is connected to first source region 14 and first body region 18 via portion 13.

Portion 12 is a layer to be joined to solder when reflow soldering is performed in facedown mounting, and as a non-limiting example, portion 12 may include a metal material containing at least one of nickel, titanium, tungsten, or palladium. The surface of portion 12 may be plated with, for example, gold.

Portion 13 of first source electrode 11 is a layer connecting portion 12 and semiconductor layer 40. As a non-limiting example, portion 13 may include a metal material containing at least one of aluminum, copper, gold, or silver.

The surface of portion 12 is exposed as the surface of semiconductor device 1 through an opening of passivation layer 35. Then, the surface of portion 12, which is exposed as the surface of semiconductor device 1 through the opening of passivation layer 35, serves as first source pad 111.

That is, first source pad 111 is the portion of the surface of first source electrode 11 that is exposed as the surface of semiconductor device 1 through the opening of passivation layer 35.

As a non-limiting example, first gate electrode 19 may include a metal material containing at least one of aluminum, copper, gold, or silver.

The surface of first gate electrode 19 is exposed as the surface of semiconductor device 1 through an opening of passivation layer 35.

Then, the surface of first gate electrode 19, which is exposed as the surface of semiconductor device 1 through the opening of passivation layer 35, serves as first gate pad 119.

That is, first gate pad 119 is the portion of first gate electrode 19 that is exposed as the surface of semiconductor device 1 through the opening of passivation layer 35.

Second source electrode 21 includes portion 22 and portion 23, and portion 22 is connected to second source region 24 and second body region 28 via portion 23.

Portion 22 is a layer to be joined to solder when reflow soldering is performed in facedown mounting, and as a non-limiting example, portion 22 may include a metal material containing at least one of nickel, titanium, tungsten, or palladium. The surface of portion 22 may be plated with, for example, gold.

Portion 23 of second source electrode 21 is a layer connecting portion 22 and semiconductor layer 40. As a non-limiting example, portion 23 may include a metal material containing at least one of aluminum, copper, gold, or silver.

The surface of portion 22 is exposed as the surface of semiconductor device 1 through an opening of passivation layer 35. Then, the surface of portion 22, which is exposed as the surface of semiconductor device 1 through the opening of passivation layer 35, serves as second source pad 121.

That is, second source pad 121 is the portion of the surface of second source electrode 21 that is exposed as the surface of semiconductor device 1 through the opening of passivation layer 35.

As a non-limiting example, second gate electrode 29 may include a metal material containing at least one of aluminum, copper, gold, or silver.

The surface of second gate electrode 29 is exposed as the surface of semiconductor device 1 through an opening of passivation layer 35. Then, the surface of second gate electrode 29, which is exposed as the surface of semiconductor device 1 through the opening of passivation layer 35, serves as second gate pad 129.

That is, second gate pad 129 is the portion of second gate electrode 29 that is exposed as the surface of semiconductor device 1 through the opening of passivation layer 35.

<Operation of Semiconductor Device>

Hereinafter, an operation of semiconductor device 1 configured as above is described.

In semiconductor device 1, a current flows from a current inlet that is one of first source pads 111 or second source pads 121 to a current outlet that is the other of first source pads 111 or second source pads 121 via the common drain region and metal layer 30.

Here, the current path in which first source pad 111 is the current inlet and second source pad 121 is the current outlet is referred to as a first current path. The current path in which second source pad 121 is the current inlet and first source pad 111 is the current outlet is referred to as a second current path.

Hereinafter, the first current path and the second current path are described with reference to FIGS. 5A and 5B.

FIG. 5A is a cross-sectional view schematically illustrating a situation in which a current is flowing along the first current path.

The first current path is formed as described below.

First, in semiconductor device 1, a voltage higher than a voltage applied to second source electrode 21 is applied to first source electrode 11.

Next, with the voltage of second source electrode 21 as a reference, a voltage greater than or equal to the threshold of second vertical MOS transistor 20 is applied to second gate electrode 29.

By doing so, a conduction channel is formed near second gate insulator film 26 in second body region 28.

In this way, the first current path is formed along which a current flows from first source electrode 11 to first body region 18 to low-concentration impurity layer 33 to semiconductor substrate 32 to metal layer 30 to semiconductor substrate 32 to low-concentration impurity layer 33 to the conduction channel formed in second body region 28 to second source region 24 to second source electrode 21 in the order stated.

At this time, although the amount is relatively minute, a current also flows along the path that bypasses metal layer 30 and along which the current flows from first area A1 to second area A2 not through metal layer 30 but through semiconductor substrate 32, and a current also flows along the path that bypasses semiconductor substrate 32 and metal layer 30 and along which the current flows from first area A1 to second area A2 not through semiconductor substrate 32 or metal layer 30 but through low-concentration impurity layer 33.

Thus, in the following explanations, these paths are regarded as also being included in the first current path.

Here, the path of a current flowing in the forward direction of a pn junction (a body diode) on the contact plane between first body region 18 and low-concentration impurity layer 33 in first vertical MOS transistor 10 is described as being part of the first current path.

By contrast, when a voltage greater than or equal to the threshold voltage of first vertical MOS transistor 10 is applied to first gate electrode 19 and a conduction channel is formed near first gate insulator film 16 in first body region 18, the path of a current flowing through the conduction channel is also part of the first current path.

When a current flows through the conduction channel, a current flows along the first current path from first source electrode 11 to first source region 14 to the conduction channel formed in first body region 18 to low-concentration impurity layer 33 to semiconductor substrate 32 to metal layer 30 to semiconductor substrate 32 to low-concentration impurity layer 33 to the conduction channel formed in second body region 28 to second source region 24 to second source electrode 21 in the order stated.

FIG. 5B is a cross-sectional view schematically illustrating a situation in which a current is flowing along the second current path.

The second current path is formed as described below.

First, in semiconductor device 1, a voltage higher than a voltage applied to first source electrode 11 is applied to second source electrode 21.

Next, with the voltage of first source electrode 11 as a reference, a voltage greater than or equal to the threshold of first vertical MOS transistor 10 is applied to first gate electrode 19.

By doing so, a conduction channel is formed near first gate insulator film 16 in first body region 18.

In this way, the second current path is formed along which a current flows from second source electrode 21 to second body region 28 to low-concentration impurity layer 33 to semiconductor substrate 32 to metal layer 30 to semiconductor substrate 32 to low-concentration impurity layer 33 to the conduction channel formed in first body region 18 to first source region 14 to first source electrode 11 in the order stated.

At this time, although the amount is relatively minute, a current also flows along the path that bypasses metal layer 30 and along which the current flows from second area A2 to first area A1 not through metal layer 30 but through semiconductor substrate 32, and a current flows through the path that bypasses semiconductor substrate 32 and metal layer 30 and along which the current also flows from second area A2 to first area A1 not through semiconductor substrate 32 or metal layer 30 but through low-concentration impurity layer 33.

Thus, in the following explanations, these paths are regarded as also being included in the second current path.

Here, the path of a current flowing in the forward direction of a pn junction (a body diode) on the contact plane between second body region 28 and low-concentration impurity layer 33 in second vertical MOS transistor 20 is described as being part of the second current path.

By contrast, when a voltage greater than or equal to the threshold voltage of second vertical MOS transistor 20 is applied to second gate electrode 29 and a conduction channel is formed near second gate insulator film 26 in second body region 28, the path of a current flowing through the conduction channel is also part of the second current path.

When a current flows through the conduction channel, a current flows along the second current path from second source electrode 21 to second source region 24 to the conduction channel formed in second body region 28 to low-concentration impurity layer 33 to semiconductor substrate 32 to metal layer 30 to semiconductor substrate 32 to low-concentration impurity layer 33 to the conduction channel formed in first body region 18 to first source region 14 to first source electrode 11 in the order stated.

<Mounting Example of Semiconductor Device>

Semiconductor device 1 described as above is mounted face down onto the mount substrate. By doing so, semiconductor device 1 is used as a switching device that switches the current path of the mount substrate between conduction and non-conduction.

Figure 6:
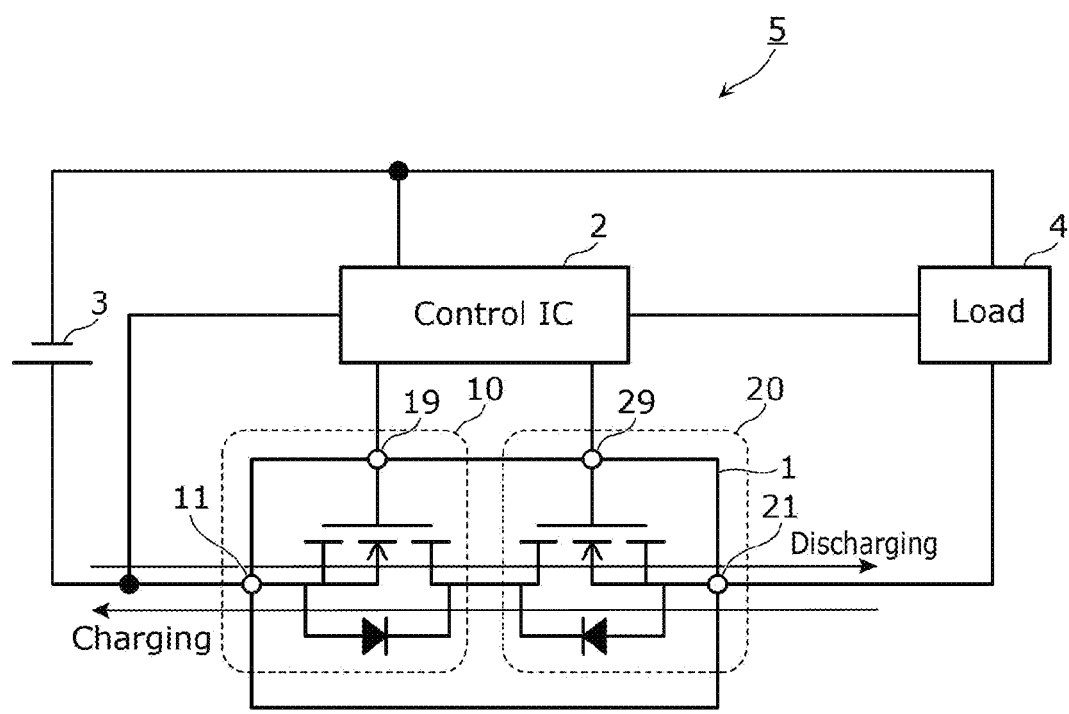
FIG. 6 is a circuit diagram of a charge and discharge circuit according to the embodiment.

FIG. 6 is a circuit diagram of charge and discharge circuit 5 as an example of a circuit in which semiconductor device 1 mounted face down onto the mount substrate is used as a switching device.

As illustrated in FIG. 6, charge and discharge circuit 5 includes semiconductor device 1, control IC 2, storage battery 3, and load 4.

By using semiconductor device 1 as a switching device, charge and discharge circuit 5 achieves discharging from storage battery 3 to load 4 and charging storage battery 3 from load 4.

Control IC_2 is connected to semiconductor device 1, and controls the voltage of first gate electrode 19 and the voltage of second gate electrode 29, thereby controlling the operation of discharging from storage battery 3 to load 4 and the operation of charging storage battery 3 from load 4.

By control IC 2 controlling the voltage of first gate electrode 19 and the voltage of second gate electrode 29, semiconductor device 1 changes the state of the current path to one of (1) a first state in which the first current path is in a conducting state, (2) a second state in which the second current path is in a conducting state, or (3) a third state in which the first current path and the second current path are in a non-conducting state. It should be noted that in the first state, it is necessary that the voltage of first source electrode 11 be higher than that of second source electrode 21, and in the second state, the voltage of second source electrode 21 be higher than that of first source electrode 11.

That is, by control IC 2 in charge and discharge circuit 5 controlling the voltage of first gate electrode 19 and the voltage of second gate electrode 29, semiconductor device 1 functions as a switching device that switches between (1) the conducting state of charge and discharge circuit 5 in which the current path of a current flowing from storage battery 3 to load 4 or the current path of a current flowing from load 4 to storage battery 3 enters a conducting state in accordance with the difference between the voltage of first source electrode 11 and the voltage of second source electrode 21 and (2) the non-conducting state of charge and discharge circuit 5 in which both the current path of the current flowing from storage battery 3 to load 4 and the current path of the current flowing from load 4 to storage battery 3 enter a non-conducting state.

Figure 7:
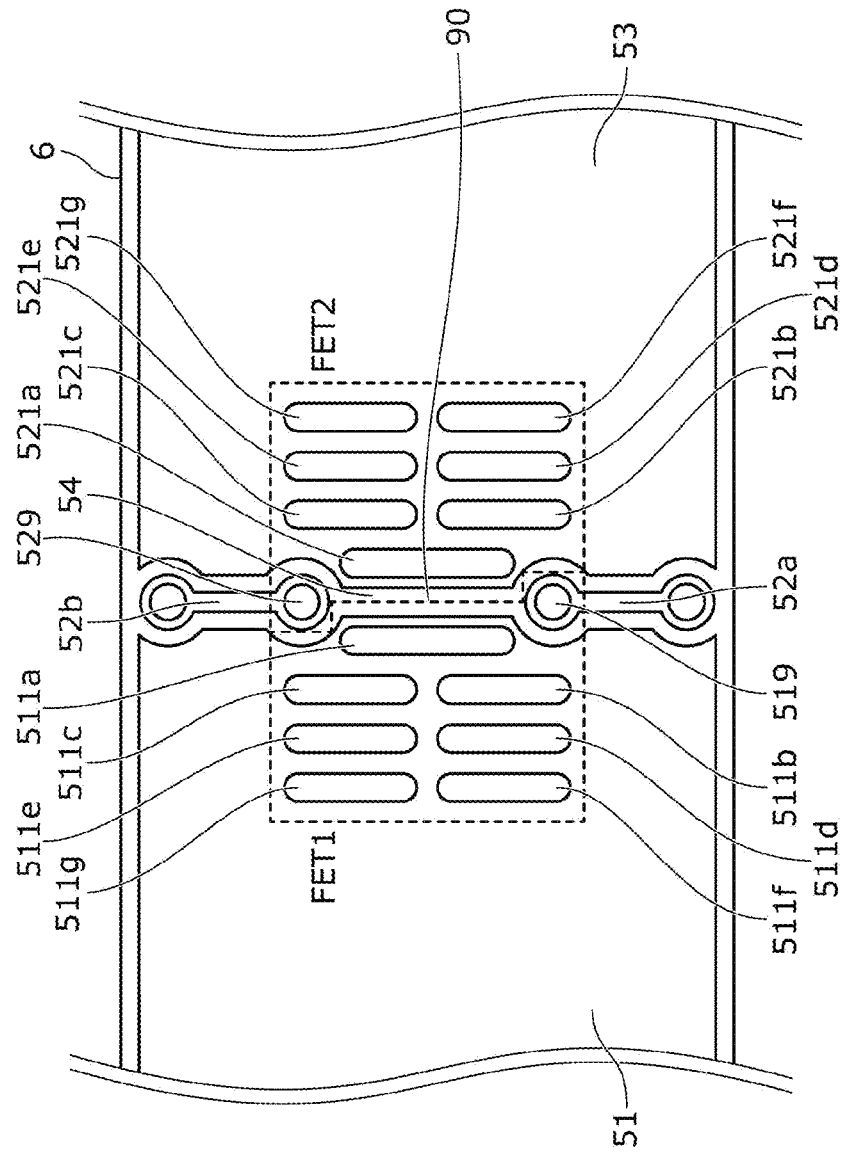
FIG. 7 is an enlarged plan view of a mount substrate according to the embodiment.
Figure 8:
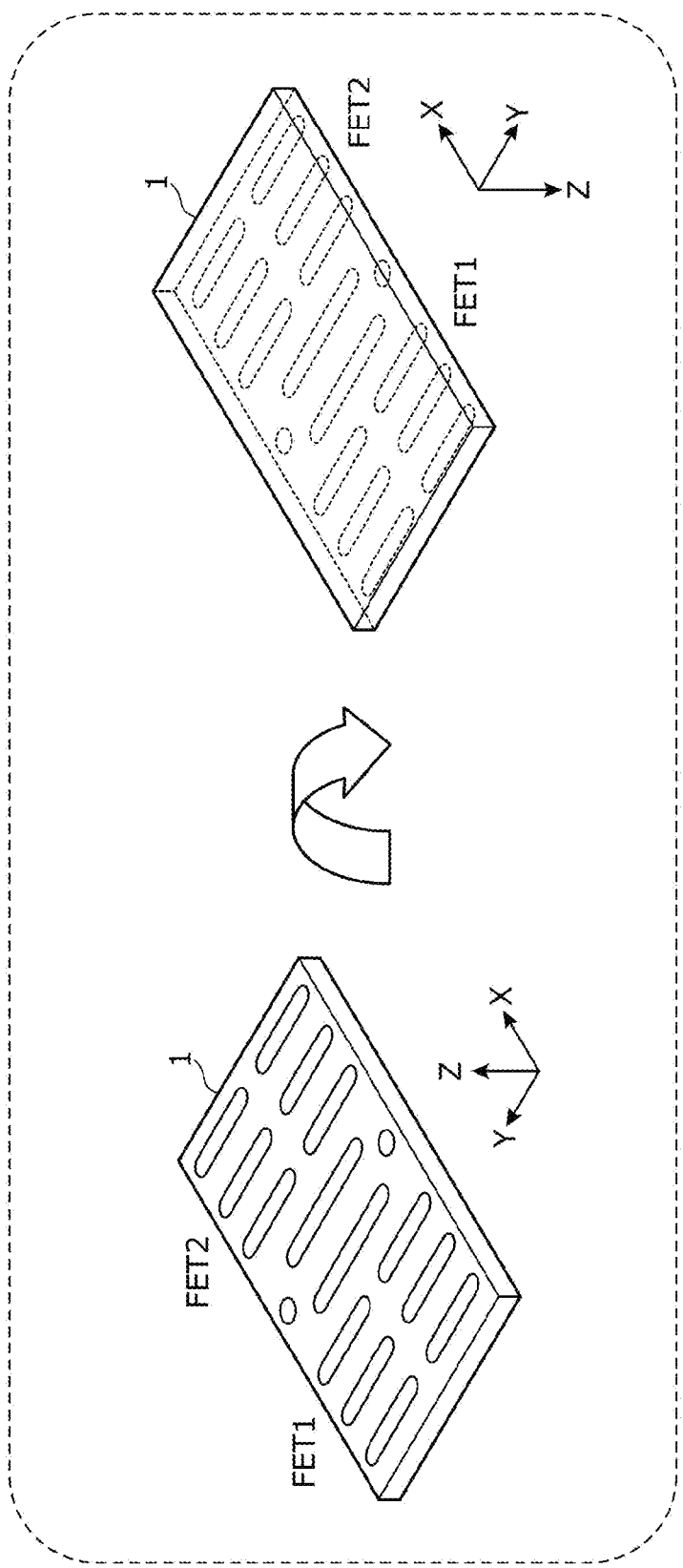
FIG. 8 is a schematic illustration illustrating a situation in which the semiconductor device according to the embodiment is turned over.

FIG. 7 is an enlarged plan view of, in charge and discharge circuit 5, a portion to which semiconductor device 1 is to be mounted, within mount substrate 6 onto which semiconductor device 1 is to be mounted face down. FIG. 8 is a schematic illustration illustrating a situation in which semiconductor device 1 is turned over to cause the front surface of semiconductor device 1 to face the front surface of mount substrate 6 when mounting semiconductor device 1 face down onto mount substrate 6, that is, a situation in which semiconductor device 1 is rotated by 180 degrees with the axis orthogonal to the Z-axis as the rotation axis (with the X-axis as the rotation axis in FIG. 8) in a manner that reverses the Z-axis direction indicated in FIG. 1.

It should be noted that in FIG. 7, the outline of semiconductor device 1 that is not mounted in reality and boundary line 90 in semiconductor device 1 are indicated by the dashed lines as if semiconductor device 1 was mounted onto mount substrate 6.

Moreover, in FIGS. 7 and 8, FET1 indicates first vertical MOS transistor 10, and FET2 indicates second vertical MOS transistor 20.

As illustrated in FIG. 7, mount substrate 6 includes wiring pattern 51, wiring pattern 52a, wiring pattern 52b, wiring pattern 53, 2n+1 first mount source pads 511 (corresponding to first mount source pads 511a to 511g in FIG. 7), first mount gate pad 519, 2n+1 second mount source pads 521 (corresponding to second mount source pads 521a to 521g in FIG. 7), second mount gate pad 529, and clearance 54.

Wiring pattern 51 is a wiring pattern provided on the top surface of mount substrate 6, and is electrically connected to storage battery 3.

Wiring pattern 53 is a wiring pattern provided on the top surface of mount substrate 6, and is electrically connected to load 4.

Wiring pattern 52a is a wiring pattern provided on the top surface of mount substrate 6, and is electrically connected to control IC 2.

Wiring pattern 52b is a wiring pattern provided on the top surface of mount substrate 6, and is electrically connected to control IC 2.

Clearance 54 is a region electrically and physically isolating wiring pattern 51 and wiring pattern 53 from one another.

First mount source pads 511a to 511g are pads provided on the top surface of wiring pattern 51 and electrically and physically connected to wiring pattern 51. When semiconductor device 1 is mounted face down onto mount substrate 6, first mount source pads 511a to 511g are joined to first source pads 111a to 111g, respectively with a bonding material such as solder.

First mount gate pad 519 is a pad provided on the top surface of wiring pattern 52a and electrically and physically connected to wiring pattern 52a. When semiconductor device 1 is mounted face down onto mount substrate 6, first mount gate pad 519 is joined to first gate pad 119 with a bonding material such as solder.

Second mount source pads 521a to 521g are pads provided on the top surface of wiring pattern 53 and electrically and physically connected to wiring pattern 53. When semiconductor device 1 is mounted face down onto mount substrate 6, second mount source pads 521a to 521g are joined to second source pads 121a to 121g, respectively with a bonding material such as solder.

Second mount gate pad 529 is a pad provided on the top surface of wiring pattern 52b and electrically and physically connected to wiring pattern 52b. When semiconductor device 1 is mounted face down onto mount substrate 6, second mount gate pad 529 is joined to second gate pad 129 with a bonding material such as solder.

As illustrated in FIG. 7, semiconductor device 1 is mounted face down to extend across clearance 54 interposed between wiring pattern 51 and wiring pattern 53 facing each other in a plan view of mount substrate 6.

More specifically, semiconductor device 1 is so mounted face down onto mount substrate 6 that first source pads 111a to 111g are joined to first mount source pads 511a to 511g, respectively with a bonding material such as solder, first gate pad 119 is joined to first mount gate pad 519 with a bonding material such as solder, second source pads 121a to 121g are joined to second mount source pads 521a to 521g, respectively with a bonding material such as solder, and second gate pad 129 is joined to second mount gate pad 529 with a bonding material such as solder.

As described above, in the plan view of semiconductor device 1, the center of first gate pad 119 is on center line 80, and no other pads are interposed between first gate pad 119 and second side 72. Thus, in the plan view of semiconductor device 1, first gate pad 119 can be disposed as close, in terms of a design rule, as possible to second side 72 at the middle position of second side 72 of semiconductor device 1 in the first direction.

Moreover, as described above, in the plan view of semiconductor device 1, the center of second gate pad 129 is on center line 80, and no other pads are interposed between second gate pad 129 and first side 71. Thus, in the plan view of semiconductor device 1, second gate pad 129 can be disposed as close, in terms of the design rule, as possible to first side 71 at the middle position of first side 71 of semiconductor device 1 in the first direction.

Accordingly, as illustrated in FIG. 7, in the plan view of mount substrate 6, (i) first mount gate pad 519 to be joined to first gate pad 119 and wiring pattern 52a connected to first mount gate pad 519 and (ii) second mount gate pad 529 to be joined to second gate pad 129 and wiring pattern 52b connected to second mount gate pad 529 can be disposed at proper positions that will not disturb the flow of a current in the discharging time current path along which a current flows from wiring pattern 51 to wiring pattern 53 when discharging from storage battery 3 to load 4 and in the charging time current path along which a current flows from wiring pattern 53 to wiring pattern 51 when charging storage battery 3 from load 4.

<Observations>

In semiconductor device 1 configured as above, in a plan view of semiconductor device 1, the longitudinal direction of semiconductor device 1 is orthogonal to the longitudinal direction of 2n+1 first source pads 111 and 2n+1 second source pads 121.

Thus, the area occupancy of 2n+1 first source pads 111 and the area occupancy of 2n+1 second source pads 121 can be made higher, in comparison with the configuration where in the plan view of semiconductor device 1, the longitudinal direction of semiconductor device 1 matches the longitudinal direction of 2n+1 first source pads 111 and 2n+1 second source pads 121.

Accordingly, in semiconductor device 1 configured as above, it is possible to decrease the continuity resistance of the current path of a current flowing between 2n+1 first source pads 111 and 2n+1 second source pads 121, in comparison with the configuration where in the plan view of semiconductor device, the longitudinal direction of semiconductor device 1 matches the longitudinal direction of 2n+1 first source pads 111 and 2n+1 second source pads 121.

Moreover, in semiconductor device 1 configured as above, in the plan view of semiconductor device 1, first closest source pad 111a and second closest source pad 121a are disposed closest to fourth segment 94 with the highest current density in the current path of a current flowing between first vertical MOS transistor 10 and second vertical MOS transistor 20. Here, first closest source pad 111a is largest first source pad 111 among 2n+1 first source pads 111, and second closest source pad 121a is largest second source pad 121 among 2n+1 second source pads 121.

Accordingly, in semiconductor device 1 configured as above, it is possible to decrease the continuity resistance of the current path of the current flowing between 2n+1 first source pads 111 and 2n+1 second source pads 121.

Moreover, semiconductor device 1 configured as above includes metal layer 30 whose specific electrical resistance is generally lower than that of semiconductor layer 40 and that serves as a part of the current path of the current flowing between first vertical MOS transistor 10 and second vertical MOS transistor 20.

Accordingly, in semiconductor device 1 configured as above, it is possible to decrease the continuity resistance of the current path of the current flowing between 2n+1 first source pads 111 and 2n+1 second source pads 121.

Moreover, in semiconductor device 1 configured as above, in the plan view of semiconductor device 1, first gate pad 119 can be disposed as close, in terms of a design rule, as possible to second side 72 at the middle position of second side 72 of semiconductor device 1 in the first direction. Furthermore, second gate pad 129 can be disposed as close, in terms of the design rule, as possible to first side 71 at the middle position of first side 71 of semiconductor device 1 in the first direction.

In this way, it is possible to suppress first gate pad 119 and second gate pad 129 from becoming disturbances to the current path of the current flowing between 2n+1 first source pads 111 and 2n+1 second source pads 121.

Accordingly, in semiconductor device 1 configured as above, it is possible to decrease the continuity resistance of the current path of the current flowing between 2n+1 first source pads 111 and 2n+1 second source pads 121.

Moreover, in semiconductor device 1 configured as above, in the plan view of semiconductor device 1, two first non-closest source pads 111bg are disposed on each first non-closest equal-interval line 81bd, and two second non-closest source pads 121bg are disposed on each second non-closest equal-interval line 82bd.

Accordingly, in semiconductor device 1 configured as above, it is possible to better suppress the occurrence of a mounting failure due to the warp of the semiconductor device, in comparison with the configuration where one first non-closest source pad 111bg is disposed on each first non-closest equal-interval line 81bd and one second non-closest source pad 121bg is disposed on each second non-closest equal-interval line 82bd. This is because the less the length in the longitudinal direction per first non-closest source pad 111bg, the occurrence frequency of mounting failure is decreased, and the less the length in the longitudinal direction per second non-closest source pad 121bg, the occurrence frequency of mounting failure is decreased.

In this way, semiconductor device 1 configured as above is semiconductor device 1 that can suppress the occurrence of a mounting failure in mounting semiconductor device 1 onto mount substrate 6, in addition to having features suitable for decreasing the continuity resistance of the current path of mount substrate 6 for mounting semiconductor device 1.

(Supplementary Notes)

Although the semiconductor device according to one aspect of the present disclosure is described above on the basis of the embodiment, the present disclosure is not limited to the embodiment. The scope of one or more aspects of the present disclosure may also encompass embodiments obtained by adding, to the embodiment, various modifications envisioned by those skilled in the art as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used as, for example, semiconductor devices to be mounted onto mount substrates.

The invention claimed is:

1. A semiconductor device that is a facedown mountable, chip-size-package type semiconductor device, the semiconductor device comprising:
  a semiconductor layer;
  a metal layer provided in contact with a back surface of the semiconductor layer;
  a first vertical metal-oxide-semiconductor (MOS) transistor provided in a first area of the semiconductor layer;
  a second vertical MOS transistor provided in a second area of the semiconductor layer, the second area being adjacent to the first area in a plan view of the semiconductor device;
  a first gate pad and 2n+1 first source pads of the first vertical MOS transistor that are provided at positions within the first area in the plan view, on a top surface of the semiconductor device, n being an integer greater than or equal to 1; and
  a second gate pad and 2n+1 second source pads of the second vertical MOS transistor that are provided at positions within the second area in the plan view, on the top surface of the semiconductor device, wherein
  on a same side as the back surface, the semiconductor layer includes a semiconductor substrate that is a common drain region shared by the first vertical MOS transistor and the second vertical MOS transistor,
  in the plan view,
    the semiconductor layer has a shape of a rectangle having a first side, a second side, a third side, and a fourth side, the first side and the second side extending in a first direction and having an equal length, the third side and the fourth side extending in a second direction orthogonal to the first direction and having an equal length that is a length less than or equal to the equal length of the first side and the second side,
    the first area and the second area are one and an other of two equal halves of an area of the semiconductor layer,
    the third side is included in a perimeter of the first area, and the fourth side is included in a perimeter of the second area,
    a boundary line between the first area and the second area is crank-shaped by connecting an entirety of a third segment, an entirety of a first segment, an entirety of a fourth segment, an entirety of a second segment, and an entirety of a fifth segment in order stated, from one end of the boundary line toward an other end of the boundary line, the first segment and the second segment extending in a straight line in the first direction, the third segment, the fourth segment, and the fifth segment extending in a straight line in the second direction, the boundary line monotonously changing in the first direction and the second direction from the one end toward the other end,
    a length of the first segment is equal to a length of the second segment,
    a length of the third segment is equal to a length of the fifth segment,
    the one end of the boundary line is on the first side, and the other end of the boundary line is on the second side,
  the fourth segment is on a virtual center line of the semiconductor layer that divides the area of the semiconductor layer into two equal halves in the plan view and extends in a straight line in the second direction,
  the first gate pad is circular, a center of the first gate pad is on the virtual center line, and no other pads are present between the first gate pad and the second side,
  the second gate pad is circular and has a diameter identical to a diameter of the first gate pad, a center of the second gate pad is on the virtual center line, and no other pads are present between the second gate pad and the first side,
  the 2n+1 first source pads and the 2n+1 second source pads each have a shape of an obround whose longitudinal direction matches the second direction, and the 2n+1 first source pads and the 2n+1 second source pads have an equal width in a lateral direction,
  the 2n+1 first source pads include a first closest source pad closest to the fourth segment and 2n first non-closest source pads not closest to the fourth segment,
  the first closest source pad is so disposed that an axis of line symmetry, extending in the longitudinal direction, of the first closest source pad matches a first closest equal-interval line closest to the fourth segment among n+1 first equal-interval lines that are virtual lines extending in the second direction in the first area and arranged at equal intervals in the first direction,
  the 2n first non-closest source pads are so disposed that with regard to each of n first non-closest equal-interval lines that are lines except the first closest equal-interval line included in the n+1 first equal-interval lines, axes of line symmetry, extending in the longitudinal direction, of two first non-closest source pads among the 2n first non-closest source pads match the first non-closest equal-interval line,
  the 2n+1 second source pads include a second closest source pad closest to the fourth segment and 2n second non-closest source pads not closest to the fourth segment,
  the second closest source pad is so disposed that an axis of line symmetry, extending in the longitudinal direction, of the second closest source pad matches a second closest equal-interval line closest to the fourth segment among n+1 second equal-interval lines that are virtual lines extending in the second direction in the second area and arranged at equal intervals in the first direction,
  the 2n second non-closest source pads are so disposed that with regard to each of n second non-closest equal-interval lines that are lines except the second closest equal-interval line included in the n+1 second equal-interval lines, axes of line symmetry, extending in the longitudinal direction, of two second non-closest source pads among the 2n second non-closest source pads match the second non-closest equal-interval line, and the 2n+1 first source pads and the 2n+1 second source pads are symmetrical with respect to the virtual center line as an axis of line symmetry.

2. The semiconductor device according to claim 1, wherein in the plan view, a length of the first closest source pad in the longitudinal direction is more than a length of each of the 2n first non-closest source pads in the longitudinal direction, and a length of the second closest source pad in the longitudinal direction is more than a length of each of the 2n second non-closest source pads in the longitudinal direction.

3. The semiconductor device according to claim 2, wherein in the plan view, (i) a closest distance between the two first non-closest source pads whose axes of line symmetry extending in the longitudinal direction match a corresponding one of the n first non-closest equal-interval lines in the plan view and (ii) a closest distance between the two second non-closest source pads whose axes of line symmetry extending in the longitudinal direction match a corresponding one of the n second non-closest equal-interval lines in the plan view are less than the diameter of the first gate pad and the diameter of the second gate pad.

4. The semiconductor device according to claim 2, wherein in the plan view, (i) a middle point of a virtual segment connecting closest points on perimeters of the two first non-closest source pads whose axes of line symmetry extending in the longitudinal direction match a corresponding one of the n first non-closest equal-interval lines in the plan view, (ii) a middle point of a virtual segment connecting closest points on perimeters of the two second non-closest source pads whose axes of line symmetry extending in the longitudinal direction match a corresponding one of the n second non-closest equal-interval lines in the plan view, (iii) a middle of the first closest source pad, and (iv) a middle of the second closest source pad are on a straight line extending in the first direction.

5. The semiconductor device according to claim 4, wherein in the plan view, a closest distance between the first side and a first non-closest source pad that is closer to the first side among the two first non-closest source pads whose axes of line symmetry extending in the longitudinal direction match the corresponding one of the n first non-closest equal-interval lines in the plan view is less than a closest distance between the first side and the first closest source pad, a closest distance between the second side and a first non-closest source pad that is closer to the second side among the two first non-closest source pads whose axes of line symmetry extending in the longitudinal direction match the corresponding one of the n first non-closest equal-interval lines in the plan view is less than a closest distance between the second side and the first closest source pad, a closest distance between the first side and a second non-closest source pad that is closer to the first side among the two second non-closest source pads whose axes of line symmetry extending in the longitudinal direction match the corresponding one of the n second non-closest equal-interval lines in the plan view is less than a closest distance between the first side and the second closest source pad, and a closest distance between the second side and a second non-closest source pad that is closer to the second side among the two second non-closest source pads whose axes of line symmetry extending in the longitudinal direction match the corresponding one of the n second non-closest equal-interval lines in the plan view is less than a closest distance between the second side and the second closest source pad.

6. The semiconductor device according to claim 4, wherein in the plan view, a distance between the first side and a middle of a first non-closest source pad that is closer to the first side among the two first non-closest source pads whose axes of line symmetry extending in the longitudinal direction match the corresponding one of the n first non-closest equal-interval lines in the plan view is more than a closest distance between the first side and the first closest source pad, a distance between the second side and a middle of a first non-closest source pad that is closer to the second side among the two first non-closest source pads whose axes of line symmetry extending in the longitudinal direction match the corresponding one of the n first non-closest equal-interval lines in the plan view is more than a closest distance between the second side and the first closest source pad, a distance between the first side and a middle of a second non-closest source pad that is closer to the first side among the two second non-closest source pads whose axes of line symmetry extending in the longitudinal direction match the corresponding one of the n second non-closest equal-interval lines in the plan view is more than a closest distance between the first side and the second closest source pad, and a distance between the second side and a middle of a second non-closest source pad that is closer to the second side among the two second non-closest source pads whose axes of line symmetry extending in the longitudinal direction match the corresponding one of the n second non-closest equal-interval lines in the plan view is more than a closest distance between the second side and the second closest source pad.

7. The semiconductor device according to claim 4, wherein in the plan view, a closest distance between the first closest source pad and the fourth segment is less than a closest distance, in the first direction, between two first source pads adjacent to each other in the first direction among the 2n+1 first source pads, and a closest distance between the second closest source pad and the fourth segment is less than a closest distance, in the first direction, between two second source pads adjacent to each other in the first direction among the 2n+1 second source pads.

8. The semiconductor device according to claim 4, wherein in the plan view, when a first length of the semiconductor layer in the first direction is defined as Lx, a second length of the semiconductor layer in the second direction is defined as Ly, and the diameter of the first gate pad and the diameter of the second gate pad are defined as d, $Ly \leq 14 \times d$, and $Lx \leq Ly + 2 \times d$.

9. The semiconductor device according to claim 4, wherein n equals 3, and in the plan view, the equal width of the 2n+1 first source pads and the 2n+1 second source pads is less than the diameter of the first gate pad and the diameter of the second gate pad.

\* \* \* \* \*